US009978597B2

(12) United States Patent
Kaneko et al.

(10) Patent No.: US 9,978,597 B2
(45) Date of Patent: May 22, 2018

(54) METHOD FOR TREATING THE SURFACE OF A SILICON-CARBIDE SUBSTRATE INCLUDING A REMOVAL STEP IN WHICH A MODIFIED LAYER PRODUCED BY POLISHING IS REMOVED BY HEATING UNDER SI VAPOR PRESSURE

(71) Applicant: KWANSEI GAKUIN EDUCATIONAL FOUNDATION, Nishinomiya-shi, Hyogo (JP)

(72) Inventors: Tadaaki Kaneko, Sanda (JP); Noboru Ohtani, Sanda (JP); Kenta Hagiwara, Sanda (JP)

(73) Assignee: KWANSEI GAKUIN EDUCATIONAL FOUNDATION, Nishinomiya-shi (JP)

( * ) Notice: Subject to any disclaimer, the term of this patent is extended or adjusted under 35 U.S.C. 154(b) by 0 days. days.

(21) Appl. No.: 14/897,342

(22) PCT Filed: Jun. 6, 2014

(86) PCT No.: PCT/JP2014/003049
§ 371 (c)(1),
(2) Date: Dec. 10, 2015

(87) PCT Pub. No.: WO2014/199615
PCT Pub. Date: Dec. 18, 2014

(65) Prior Publication Data
US 2016/0118257 A1 Apr. 28, 2016

(30) Foreign Application Priority Data
Jun. 13, 2013 (JP) .................................. 2013-125020

(51) Int. Cl.
*H01L 21/20* (2006.01)
*H01L 21/36* (2006.01)
(Continued)

(52) U.S. Cl.
CPC .......... *H01L 21/0475* (2013.01); *C30B 29/36* (2013.01); *C30B 33/00* (2013.01);
(Continued)

(58) Field of Classification Search
CPC ......... H01L 21/02378; H01L 21/02433; H01L 21/02529; H01L 21/0262; H01L 21/0475;
(Continued)

(56) References Cited

U.S. PATENT DOCUMENTS

| 6,734,461 B1 * | 5/2004 | Shiomi | C30B 23/00 257/194 |
| 2006/0102068 A1 * | 5/2006 | Tsvetkov | C30B 29/36 117/89 |
| 2011/0156058 A1 * | 6/2011 | Hori | B24B 37/042 257/77 |

FOREIGN PATENT DOCUMENTS

| JP | 2008-16691 | | 1/2008 |
| JP | 2008016691 | * | 1/2008 |

(Continued)

OTHER PUBLICATIONS

International Search Report dated Sep. 2, 2014, issued in counterpart application No. PCT/JP2014/003049 (1 page).

*Primary Examiner* — Duy T Nguyen
(74) *Attorney, Agent, or Firm* — Westerman, Hattori, Daniels & Adrian, LLP

(57) ABSTRACT

This method for treating a surface of a SiC substrate includes a first removal step in which a modified layer produced by subjecting the substrate (70) to mechanical polishing or chemical-mechanical polishing is removed by heating the substrate (70) under Si vapor pressure. A second removal step in which macro-step bunching occurred in an epitaxial layer (71) is removed by heating the substrate (70) under Si vapor pressure may also be performed. Since the etching rate can be varied, etching rate in the first removal step is high, (Continued)

so that the modified layer can be removed in a short time. Meanwhile, etching rate in the second removal step is comparatively low, so that excessive removal of the epitaxial layer (71) can be prevented.

14 Claims, 19 Drawing Sheets

(51) Int. Cl.
*H01L 21/04* (2006.01)
*C30B 29/36* (2006.01)
*C30B 33/00* (2006.01)
*H01L 21/3065* (2006.01)
*H01L 21/02* (2006.01)
*H01L 21/306* (2006.01)
*H01L 21/302* (2006.01)
*H01L 21/67* (2006.01)
*H01L 21/687* (2006.01)

(52) U.S. Cl.
CPC .... *H01L 21/0262* (2013.01); *H01L 21/02378* (2013.01); *H01L 21/02433* (2013.01); *H01L 21/02529* (2013.01); *H01L 21/302* (2013.01); *H01L 21/3065* (2013.01); *H01L 21/30604* (2013.01); *H01L 21/30625* (2013.01); *H01L 21/67069* (2013.01); *H01L 21/67109* (2013.01); *H01L 21/67115* (2013.01); *H01L 21/68792* (2013.01)

(58) Field of Classification Search
CPC ......... H01L 21/30604; H01L 21/30625; H01L 21/3065; C30B 29/36; C30B 33/00
USPC .................................................. 438/478, 492
See application file for complete search history.

(56) References Cited

FOREIGN PATENT DOCUMENTS

| | | | |
|---|---|---|---|
| JP | 201052997 | * | 3/2010 |
| JP | 2011-233780 | | 11/2011 |
| JP | 2011233780 | * | 11/2011 |
| JP | 2012-176867 A | | 9/2012 |
| JP | 2012-193055 | | 10/2012 |

* cited by examiner (a)

(b)

(a) CUTTING OUT OF OFF-ANGLED SUBSTRATE AND MECHANICAL POLISHING

CONVENTIONAL TECHNIQUE

SUBSTRATE: 4H-SiC(0001)
4° OFF-ANGLED
IN THE DIRECTION OF <11-20>

SURFACE ROUGHNESS
(AFM SHAPE IMAGE)

(b) CHEMICAL-MECHANICAL POLISHING (c) EPITAXIAL LAYER FORMATION STEP (CVD PROCESS)

(a) STATUS OF CRUCIBLE WHEN HEATING UNDER Si HIGH PRESSURE ATMOSPHERE (b) STATUS OF CRUCIBLE WHEN HEATING UNDER Si LOW PRESSURE ATMOSPHERE (a) CUTTING OUT OF OFF-ANGLED SUBSTRATE AND MECHANICAL POLISHING

THIS EMBODIMENT
SUBSTRATE: 4H-SiC(0001)
4° OFF-ANGLED
IN THE DIRECTION OF <11-20>

SURFACE ROUGHNESS
(AFM SHAPE IMAGE)

(b) FIRST REMOVAL STEP
(HEATING UNDER Si ATMOSPHERE)

(c) EPITAXIAL LAYER FORMATION STEP
(CVD PROCESS)

(d) SECOND REMOVAL STEP
(HEATING UNDER Si ATMOSPHERE)

(a1) MODEL OF MACRO-STEP BUNCHING SUPPRESSION (b1) MODEL OF MACRO-STEP BUNCHING OCCURRENCE (a2)

(b2)

US 9,978,597 B2

METHOD FOR TREATING THE SURFACE OF A SILICON-CARBIDE SUBSTRATE INCLUDING A REMOVAL STEP IN WHICH A MODIFIED LAYER PRODUCED BY POLISHING IS REMOVED BY HEATING UNDER SI VAPOR PRESSURE

TECHNICAL FIELD

The present application is a 371 national stage of PCT application PCT/JP2014/003049 filed on Jun. 6, 2014 and claims priority under 35 U.S.C. 119 to Japanese application JP2013-125020 filed on Jun. 13, 2013. The present invention relates to a method for treating a surface of a substrate that is made of, at least in a surface thereof, a SiC layer.

BACKGROUND ART

Silicon (Si), gallium arsenide (GaAs), and the like, are conventionally known as a semiconductor material. Recently, the field of use of a semiconductor element is rapidly expanding. The semiconductor element is accordingly more often used under severe environments such as a high temperature environment. Therefore, achievement of a semiconductor element that is able to withstand a high temperature environment is one of important problems from the viewpoint of a reliable operation, processing of a large amount of information, and improvement in the controllability in wide ranges of applications and environments.

Silicon carbide (SiC) is of interest as one of materials that can be used for manufacturing a semiconductor element having an excellent heat resistance. SiC has an excellent mechanical strength and a radiation hardness. Moreover, adding impurities to SiC enables a valence electron such as an electron or a hole to be easily controlled, and SiC is characterized in a wide band gap (about 2.93 eV in 6H single crystal SiC; 3.26 eV in 4H single crystal SiC). This is why SiC is expected as a material for a next-generation power device that achieves a high-temperature resistance, high frequency resistance, high voltage resistance, and high environment resistance, which cannot be achieved by the existing semiconductor material described above. Methods for manufacturing a semiconductor material using SiC are disclosed in Patent Documents 1 to 3.

Patent Document 1 discloses a method for manufacturing a SiC semiconductor having high quality, when generation of SiC polycrystalline is suppressed by uniformizing the temperature in a growth furnace causing a growth of a seed crystal. Patent Document 2 discloses a method for manufacturing a SiC semiconductor having little defect and high quality by forming a plurality of recesses in a seed crystal.

PRIOR-ART DOCUMENTS

Patent Documents

Patent Document 1: Japanese Patent Application Laid-Open No. 2012-193055
Patent Document 2: Japanese Patent Application Laid-Open No. 2012-176867

SUMMARY OF THE INVENTION

Problems to be Solved by the Invention

Meanwhile, a semiconductor material using SiC is manufactured by using a bulk substrate cut out of an ingot, that is made of a single crystal SiC, at a predetermined angle. The surface of the bulk substrate needs to be planarized by mechanical polishing or the like. Since mechanical polishing causes generation of polishing scratches of submicron order, however, the polishing scratches are removed by chemical-mechanical polishing conventionally, and thereby the substrate is further planarized.

After that, an epitaxial layer is formed on the surface of the substrate by a CVD process (chemical vapor deposition) or the like. When the CVD process is performed, however, many latent scratches are exposed on the surface of the substrate. The applicant of this application analyzed the above-described matter. Then, they found that the cause of this matter is mechanical distortion (hereinafter, called a modified layer) caused by adding the pressure on the surface of the substrate during mechanical polishing.

As shown in FIG. 19, however, this modified layer is produced at a depth of about 10000 nm from the surface of the substrate. Polish rate of chemical-mechanical polishing is about 2 nm/min. Accordingly, it takes a lot of time, eighty hours or more, to remove the modified layer by chemical-mechanical polishing. It takes eighty hours or more in a case of etching by hydrogen gas instead of chemical-mechanical polishing. Thus, in the conventional method, the production efficiency of the semiconductor element is significantly deteriorated. The prior art of the Patent documents 1, 2 or the like do not disclose a method for solving these problems.

The present invention has been made in view of the circumstances described above, and a primary object of the present invention is to provide a method for treating a surface of SiC substrate, which takes short period of time to remove a modified layer produced by subjecting a bulk substrate to mechanical polishing.

Means for Solving the Problems and Effects Thereof

Problems to be solved by the present invention are as described above, and next, means for solving the problems and effects thereof will be described.

In an aspect of the present invention, the method for treating a surface using a substrate having an off angle and at least its surface made of a SiC (0001)-face is provided. The method for treating a surface of a SiC substrate includes a first removal step for removing a modified layer produced by subjecting the substrate to mechanical polishing or chemical-mechanical polishing by heating the substrate under Si vapor pressure.

Accordingly, removing the modified layer by the first removal step can prevent occurrence of latent scratches. This enables to improve a yield of a semiconductor element. Additionally, since the etching rate (polish rate) is high in the first removal step, the modified layer can be removed in a short time and the production efficiency of the semiconductor element can be improved.

In the first removal step of the method for treating the surface of the SiC substrate, heating is preferably performed in a temperature range of 1800° C. or more and 2200° C. or less, and under Si pressure of $10^{-2}$ Pa or more.

Accordingly, the etching rate in the first removal step can be controlled at about 500 nm/min or more in a case of treating at about 2000° C. or more. This enables to remove the modified layer in a short time.

In the method for treating the surface of the SiC substrate, a second removal step is preferably performed for removing macro-step bunching produced on an epitaxial layer formed on the surface of the substrate using a chemical vapor deposition process by heating the substrate under Si pressure.

Accordingly, macro-step bunching produced on the surface of the substrate can be appropriately removed.

In the second removal step of the method for treating the surface of the SiC substrate, the etching rate is preferably lower than that of the first removal step.

In the first removal step, a modified layer can be removed if they are removed at a depth of about 1 µm from the surface of the substrate. On the other hand, in the second removal step, macro-step bunching can be removed if they are removed about at a depth of several ten nm from the surface of the substrate depending on the condition. The etching rate of the first removal step is higher than that of the second removal step and thereby the treatment can be efficiently performed. The etching rate of the second removal step is suppressed and thereby excessive removal of an epitaxial layer can be prevented.

In the second removal step of the method for treating the surface of the SiC substrate, heating is preferably performed in a temperature range of 1600° C. or more and 2000° C. or less, and under Si pressure of $10^{-3}$ Pa or less.

Accordingly, heat treatment under Si pressure within the above-described range is performed and thereby a portion at which macro-step bunching is formed can be removed quickly and excessive removal of an epitaxial layer can be prevented.

In the method for treating the surface of the SiC substrate, in consideration of the relationship between heating condition including Si pressure, heating temperature and etching rate and the presence or absence of occurrence of macro-step bunching, the heating condition is preferably determined in at least either one of the first removal step or the second removal step.

Accordingly, a desired heating condition is set and macro-step bunching can be reliably removed.

In the method for treating the surface of the SiC substrate, preferably, the heating condition is determined in further consideration of the off angle of the substrate.

Since the presence or absence of occurrence of macro-step bunching is related to the off angle of the substrate, taking this relationship into consideration and determining the heat condition enables to further reliably prevent occurrence of macro-step bunching.

In the method for treating the surface of the SiC substrate, the surface of the SiC substrate preferably has an off angle of 4 degrees or less in the direction of <11-20>.

In the method for treating the surface of the SiC substrate, the surface of the SiC substrate preferably has an off angle of 4 degrees or less in the direction of <1-100>.

In the method for treating the surface of the SiC substrate, the surface of the SiC layer is preferably terminated at a step having a full-unit height that corresponds to one periodic of SiC molecules in a stack direction or a half-unit height that corresponds to one-half periodic.

Accordingly, a surface of a substrate has a high flatness and therefore a semiconductor element having high quality can be manufactured.

EMBODIMENT FOR CARRYING OUT THE INVENTION

Next, an embodiment of the present invention will be described.

Figure 1:
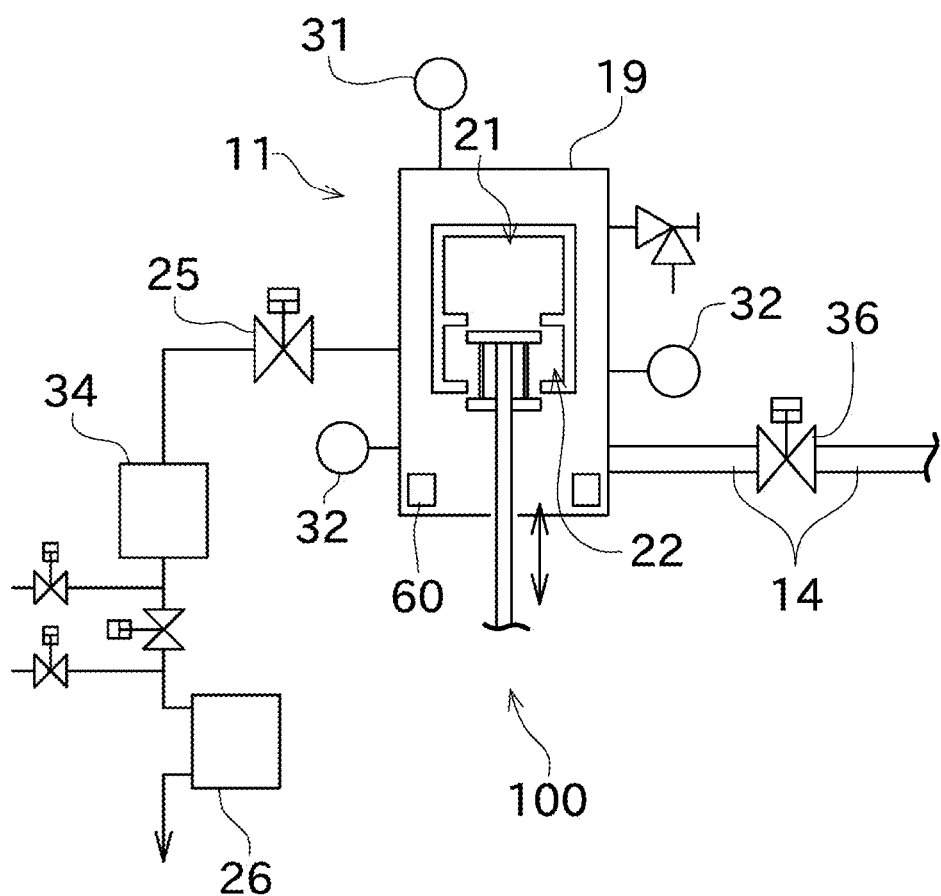
FIG. 1 A schematic view showing a high-temperature vacuum furnace for use in a heat treatment for manufacturing a semiconductor element.
Figure 2:
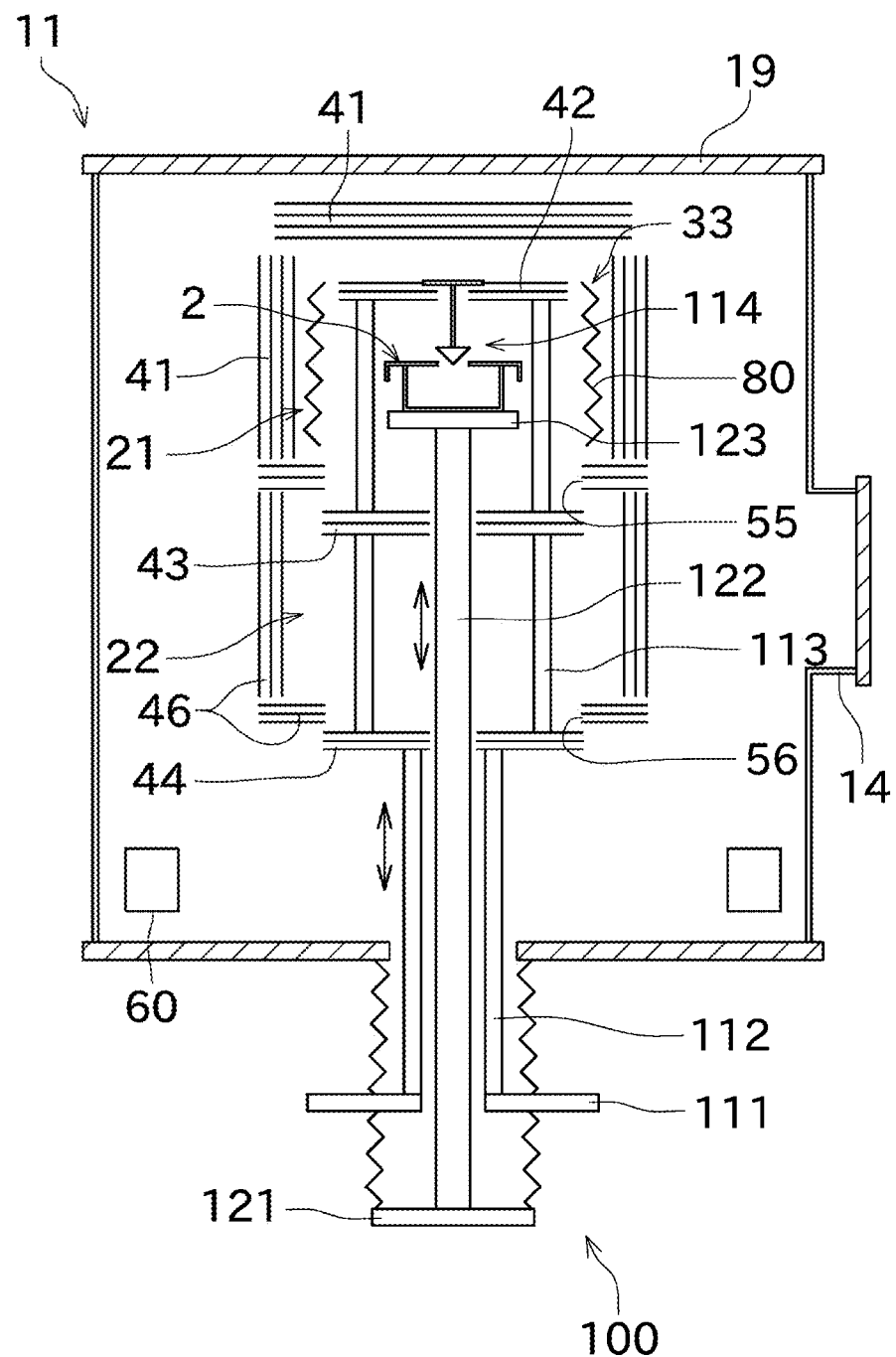
FIG. 2 A cross-sectional view showing a mechanism in detail for controlling degree of sealing of a crucible in a main heating chamber of a high-temperature vacuum furnace.
Figure 3:
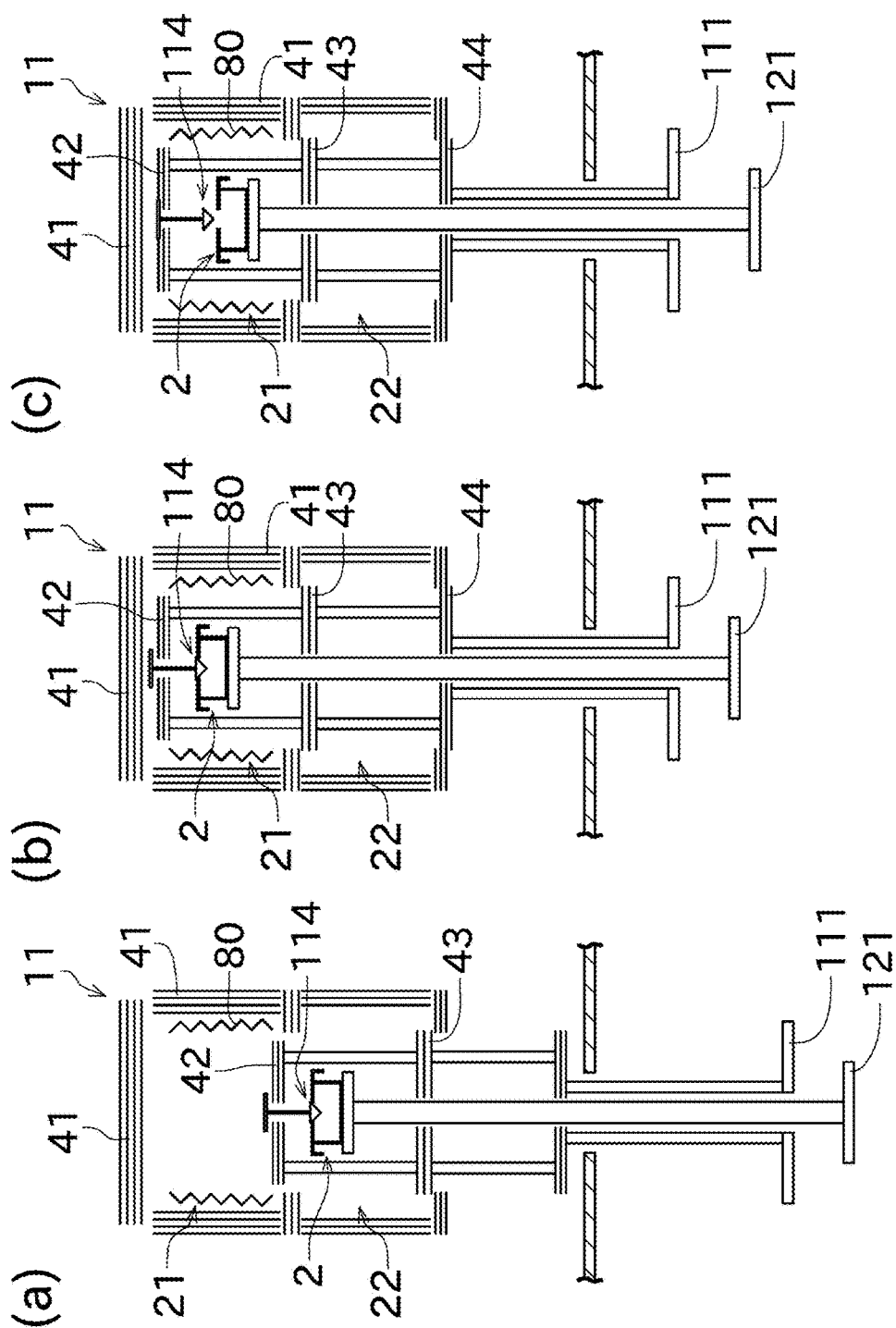
FIG. 3(a) A cross-sectional front elevation view of a high-temperature vacuum furnace in a case that a crucible is in a preheating chamber. (b) A cross-sectional front elevation view of a high-temperature vacuum furnace in a case that a sealed crucible is in a heating chamber. (c) A cross-sectional front elevation view of a high-temperature vacuum furnace in a case that a opened crucible is in a heating chamber.

A high-temperature vacuum furnace (heating furnace) 11 and a crucible (storing container) 2 used for manufacturing a semiconductor element will be described. FIG. 1 is a schematic view showing a high-temperature vacuum furnace for use in a heat treatment for manufacturing a semiconductor element. FIG. 2 is a cross-sectional view showing mechanism details of controlling degree of sealing of a crucible in a main heating chamber of the high-temperature vacuum furnace. FIG. 3 is a cross-sectional front elevation view of the arrangement of the crucible and the like in the high-temperature vacuum furnace 11.

As shown in FIG. 1 and FIG. 2, the high-temperature vacuum furnace 11 includes a main heating chamber 21 and a preheating chamber 22. The main heating chamber 21 enables a processing object stored in a crucible 2 to be heated to a temperature of 1000° C. or more and 2300° C. or less. The preheating chamber 22 enables a processing object to be preheated to a temperature of 500° C. or more. The preheating chamber 22 is arranged below the main heating chamber 21, and adjacent to the main heating chamber 21 with respect to the vertical direction.

The high-temperature vacuum furnace 11 includes a vacuum chamber 19. The main heating chamber 21 and the preheating chamber 22 are arranged inside the vacuum chamber 19. A turbo-molecular pump 34 serving as a vacuum-producing apparatus is connected to the vacuum chamber 19, so that a vacuum of, for example, $10^{-2}$ Pa or less, and desirably $10^{-7}$ Pa or less, can be produced inside the vacuum chamber 19. A gate valve 25 is interposed between the turbo-molecular pump 34 and the vacuum chamber 19. An auxiliary rotary pump 26 is connected to the turbo-molecular pump 34.

A vacuum meter 31 for measuring the degree of vacuum and a mass spectrometry apparatus 32 for performing mass spectrometry are provided in the high-temperature vacuum furnace 11. The vacuum chamber 19 is connected via a transport path 14 to a stock storage (not shown) for storing processing objects. The transport path 14 can be opened and closed by a gate valve 36.

The main heating chamber 21, whose cross-section has a regular nonagonal shape in a plan view, is arranged in an upper portion of an internal space of the vacuum chamber 19. As shown in FIG. 2, a heating apparatus 33 is provided in the main heating chamber 21. The heating apparatus 33 has at least one mesh heater (heater) 80 arranged so as to surround the main heating chamber 21 and a power source and the like for applying current to the mesh heater 80. The heating apparatus 33 adjusts current applying to the mesh heater 80 based on the detected result of a temperature detector (not shown). This enables to accurately control temperature distribution throughout an interior of the main heating chamber 21. At least one first multi-layer heat reflection metal plate 41 is fixed to a sidewall and a ceiling of the main heating chamber 21. The first multi-layer heat reflection metal plate 41 is configured to reflect heat generated from the mesh heater 80 toward a central area of the main heating chamber 21.

As a result, a layout in which the mesh heater 80 surrounds a processing object which is a target of heat treatment and the at least one multi-layer heat reflection metal plate 41 is arranged further outside the mesh heater 80 is achieved in the main heating chamber 21. This enables the processing object to be strongly and uniformly heated, and its temperature to be raised up to 1000° C. or more and 2300° C. or less.

The ceiling side of the main heating chamber 21 is closed by the first multi-layer heat reflection metal plate 41. The first multi-layer heat reflection metal plate 41 arranged on a bottom surface of the main heating chamber 21 has at least one opening 55. The crucible 2 is movable through at least one opening 55 between the main heating chamber 21 and the preheating chamber 22 arranged below and adjacent to the main heating chamber 21.

The preheating chamber 22 is formed by at least one multi-layer heat reflection metal plate 46 enclosing a space existing below the main heating chamber 21. The preheating chamber 22 has a circular cross-section in a plan view. Heating means such as the mesh heater 33 is not provided in the preheating chamber 22.

The multi-layer heat reflection metal plate 46 that defines a sidewall of the preheating chamber 22 has an open/close member (not shown). The open/close member is positioned at a location opposed to the transport path 14. The open/close member enables to switch between the conditions which the crucible 2 can be transported with a passage hole formed at a location opposed to the transport path 14 and which heat treatment can be performed with the passage hole closed.

As shown in FIG. 2, the multi-layer heat reflection metal plate 46 arranged on a bottom surface of the preheating chamber 22 has at least one opening 56.

The high-temperature vacuum furnace 11 includes a moving mechanism 100 for vertically moving the crucible 2. The moving mechanism 100 is configured to move a first support member 111 and a second support member 121 independently and vertically.

A first elevation shaft 112 is connected to an upper portion of a first support member 111. A fourth multi-layer heat reflection metal plate 44 is arranged at an upper portion of the first elevation shaft 112. The fourth multi-layer heat reflection metal plate 44, a third multi-layer heat reflection metal plate 43 positioned at an upper side thereof, and a second multi-layer heat reflection metal plate 42 positioned at a further upper side thereof are spaced apart from one another and are coupled to one another by at least one column portion 113 that is provided vertically. A lid (adjustment mean) 114 is mounted on the second multi-layer heat reflection metal plate 42 for adjusting the degree of sealing of the crucible 2. The lid 114 is located at an upper side of a tray 123 which will be described later. The stacked number of the second multi-layer heat reflection metal plates 42 is less than the number of the stacked number of first multi-layer heat reflection metal plates 41 that is arranged in the main heating chamber 21.

On the other hand, a second elevation shaft 122 is connected to an upper portion of a second support member 121. The second elevation shaft 122 is arranged so as to be inserted into a hole formed at the center of the third multi-layer heat reflection metal plate 43 and the fourth multi-layer heat reflection metal plate 44. The second elevation shaft 122 is movable relative to the third multi-layer heat reflection metal plate 43 and the fourth multi-layer heat reflection metal plate 44. The tray 123 made of tungsten for placing the crucible 2 is connected to an upper end portion of the second elevation shaft 122. A hole is formed at an upper portion of the crucible 2 used in this embodiment. Changing the positional relationship between the hole and the lid 114 enables to adjust the degree of sealing of the crucible 2.

As shown in FIG. 2, a shroud 60 is arranged below the fourth multi-layer heat reflection metal plate 44. Liquid nitrogen circulates through the shroud 60. Unnecessary gas discharged from the main heating chamber 21 is adsorbed to the surface of the shroud 60 in contacting with the shroud 60, and unnecessary gas is successfully discharged from the main heating chamber 21. This enables to keep the degree of vacuum in the main heating chamber 21.

A description of an example will be given of a flow of heat treatment performed by the above configured high-temperature vacuum furnace 11. Firstly, the crucible 2 storing a processing object is introduced into the vacuum chamber 19 through the transport path 14, and placed on the tray 123 arranged in the preheating chamber 22 (see FIG. 3(a)). In this condition, the heating apparatus 33 is driven, so that the main heating chamber 21 is heated to a predetermined temperature of 1000° C. or more and 2300° C. or less (for example, about 1800° C.). At this time, by driving the turbo-molecular pump 34, the pressure in the vacuum chamber 19 is adjusted to $10^{-2}$ Pa or less, and preferably $10^{-7}$ Pa or less.

As mentioned above, the stacked number of the second multi-layer heat reflection metal plates 42 is less than the stacked number of the first multi-layer heat reflection metal plates 41. Therefore, part of the heat generated by the mesh heater 80 of the heating apparatus 33 can be moderately supplied (distributed) to the preheating chamber 22 via the second multi-layer heat reflection metal plates 42 so that the processing object placed in the preheating chamber 22 is preheated to a predetermined temperature of 500° C. or more (for example, 800° C.). Thus, preheating is achieved even though no heater is provided in the preheating chamber 22, and a simple structure of the preheating chamber 22 is achieved.

After the above-mentioned preheating treatment is performed for a predetermined time period, the first support member 111 and the first elevation shaft 112 are moved up. As a result, the crucible 2 passes through at least one opening 55, and moves into the main heating chamber 21, and then the main heating chamber 21 is closed by the third multi-layer heat reflection metal plates 43. This allows the heat treatment to be started immediately, and the temperature of the processing object placed in the main heating chamber 21 can be rapidly raised to a predetermined temperature (about 1900° C.). At this time, the second support member 121 is moved up and down so that the degree of sealing of the crucible 2 is changed. This enables to adjust the inside pressure of the crucible 2 (the detail will be described later).

Any of the above shown multi-layer heat reflection metal plates 41 to 44, 46 is structured such that metal plates (made of tungsten) are stacked with predetermined intervals therebetween.

Any material is adoptable for the multi-layer heat reflection metal plates 41 to 44, 46, as long as the material has sufficient heating characteristics relative to thermal radiation of the mesh heater 80 and the melting point of the material is higher than the ambient temperature. For example, not only the tungsten, but also a metal material having a high melting point, such as tantalum, niobium, and molybdenum, is adoptable for the multi-layer heat reflection metal plates 41 to 44, 46. Alternatively, a carbide such as tungsten carbide, zirconium carbide, tantalum carbide, hafnium carbide, and molybdenum carbide is adoptable for the multi-layer heat reflection metal plates 41 to 44, 46. It may be also acceptable that an infrared reflective coating made of gold, tungsten carbide, or the like, is further formed on reflecting surfaces of the multi-layer heat reflection metal plates 41 to 44, 46.

Figure 4:
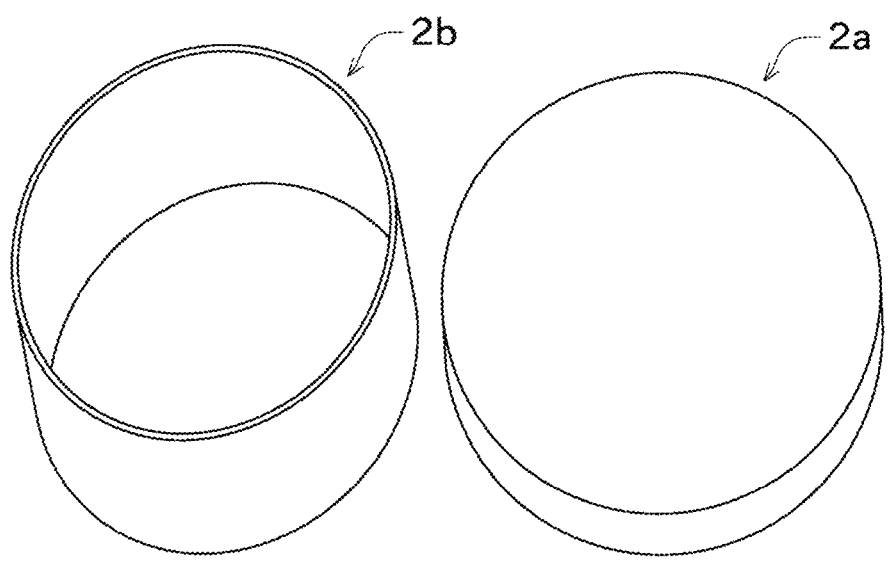
FIG. 4 Photographs of an external appearance and a cross-section of a crucible having a carbon getter effect.
Figure 4:
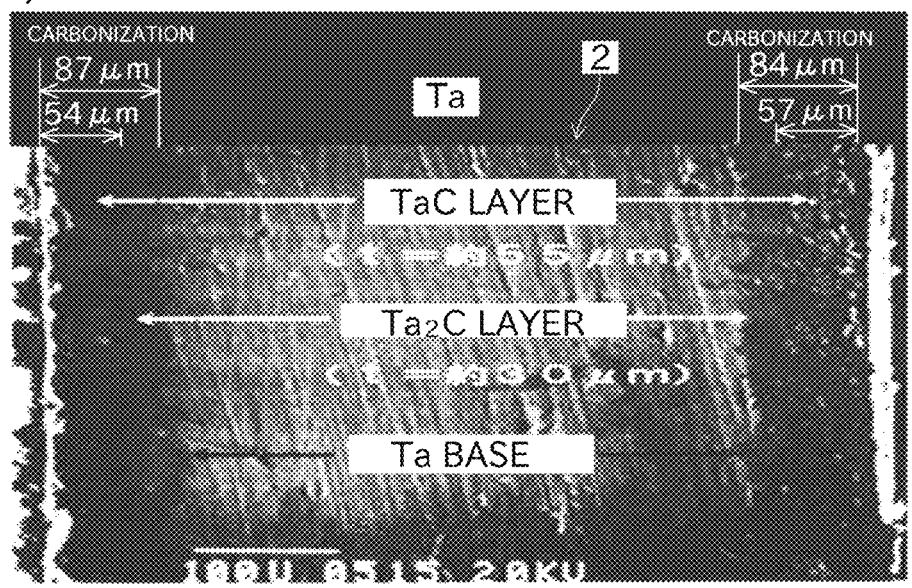
Figure 5:
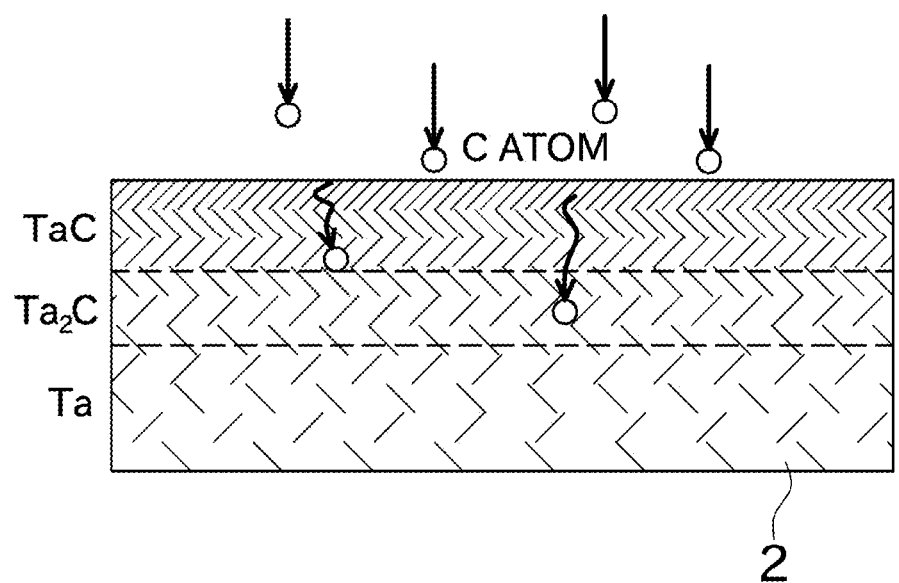
FIG. 5 A schematic view for explanation of a carbon getter effect.

Next, the crucible 2 will be described with reference to FIG. 4 and FIG. 5. FIG. 4 is photographs of an external appearance and a cross-section of a crucible having a carbon getter effect. FIG. 5 is a schematic view for explanation of the carbon getter effect. As shown in FIG. 4(a), the crucible 2 is a fitted casing including an upper casing 2a and a lower casing 2b that are fittable to each other. The crucible 2 is configured to exert a carbon getter effect, which will be described later, in a case of performing a high temperature treatment in a vacuum environment. More specifically, the crucible 2 is made of tantalum metal, and includes a tantalum carbide layer that is exposed to an internal space of the crucible 2.

In more detail, as shown in FIG. 4(b), the crucible 2 includes a TaC layer formed in a most superficial layer, a $Ta_2C$ layer formed inner than the TaC layer, and tantalum metal, which serves as a base material, arranged further inner than the $Ta_2C$ layer. Since the state of bonding between tantalum and carbon exhibits a temperature dependency, the crucible 2 is configured such that TaC having a high carbon concentration is arranged in a most superficial portion, $Ta_2C$ having a relatively less carbon concentration is arranged inside TaC, and tantalum metal serving as the base material, whose carbon concentration is zero, is arranged further inside $Ta_2C$.

As described above, the surface of the crucible 2 is covered with a tantalum carbide layer (TaC layer), that is exposed to an internal space of the crucible 2. Accordingly, as long as the high temperature treatment is performed in a vacuum environment as described above, the crucible 2 exerts a function for continuous adsorption and intake of carbon atoms from a surface of the tantalum carbide layer, as shown in FIG. 5. In this sense, it can be said that the crucible 2 of this embodiment has a carbon atom adsorption ion pump function (ion getter function). Thus, in silicon vapor and silicon carbide vapor contained in the atmosphere within the crucible 2 during the heat treatment, only carbon is selectively adsorbed and stored in the crucible 2. This can keep a high purity silicon atmosphere within the crucible 2.

In this embodiment, the high-temperature vacuum furnace 11 and the crucible 2 having the above-described configurations are used to manufacture a semiconductor element from a substrate. In the following description, a heat treatment using the above-described high-temperature vacuum furnace 11 will be referred to simply as, for example, a heat treatment.

Figure 6:
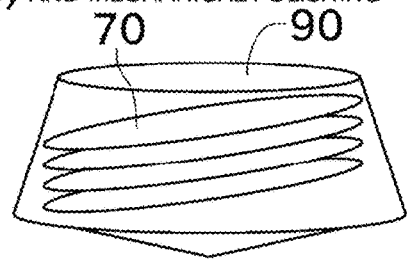
FIG. 6 A diagram shown by a schematic view and an atomic force photomicrograph of a method for treating a surface of a substrate in a conventional technique. (a) A diagram showing a surface shape of a substrate in which 4H—SiC bulk single crystal is off-angled at 4 degrees in the direction of <11-20> from (0001)-face and cut out, the surface shape of the substrate having polishing scratches after mechanical polishing. (b) A diagram showing a surface shape of a substrate after performing chemical-mechanical polishing on the substrate. (c) A diagram showing surface defects appeared when a SiC epitaxial layer is grown at 1500° C. using a CVD process and then high-temperature annealing at 1600° C. is performed on a substrate (a shape of a surface affected by which surface processing distortion (latent scratches) spread an epitaxial layer by means of high-temperature annealing after an epitaxial growth, the surface processing distortion are accumulated when performing mechanical polishing or chemical-mechanical polishing on a surface of a substrate before an epitaxial layer formation).
Figure 6:
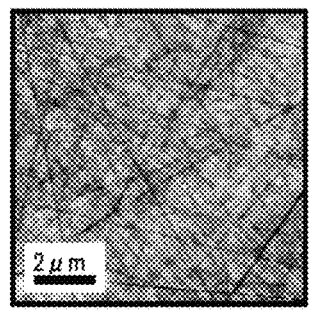
Figure 6:
Figure 6:
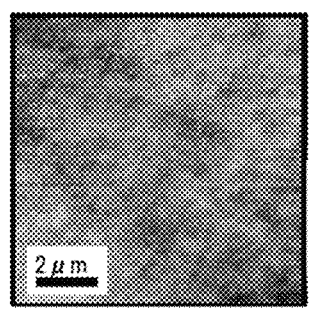
Figure 6:
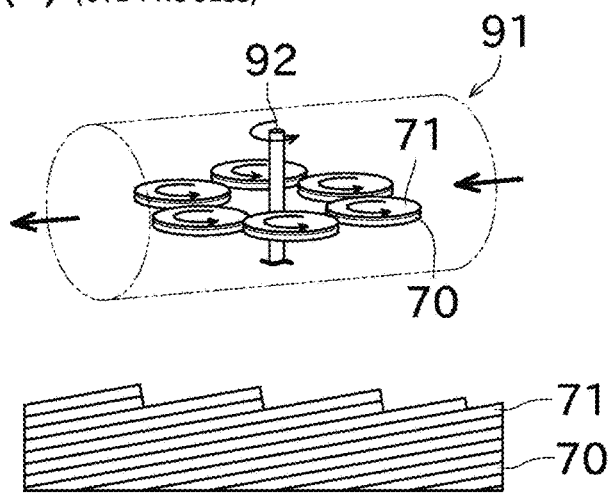
Figure 6:
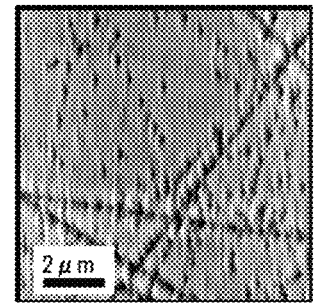

Next, a method for treating a surface of a substrate performed in course of a process of a method for manufacturing a semiconductor element will be described. Firstly, the conventional method for treating a surface and the problems thereof will be described. FIG. 6 is a diagram shown by a schematic view and an atomic force photomicrograph of a method for treating a surface of a substrate in a conventional technique. A substrate 70 in FIG. 6 or the like is schematically shown in a cross-sectional view of the substrate.

A bulk substrate, used for manufacturing the semiconductor element, can be obtained by cutting out of an ingot 90 configuring a 4H—SiC single crystal or 6H—SiC single crystal at a predetermined angle. Particularly, cutting obliquely out of the ingot 90 enables to obtain a substrate 70 having an off-angle. After that, mechanical polishing is performed on the substrate 70 for removing unevenness of the surface of the substrate 70. As shown in a photomicrograph of FIG. 6(a), a plurality of polishing scratches is formed on the surface of the substrate 70 after performing mechanical polishing.

Therefore, chemical-mechanical polishing has been conventionally used as the method for further planarizing the substrate 70. Chemical-mechanical polishing is a polishing method, which exerts an effect of mechanical polishing more efficiently by chemical action included in polishing liquid or surface chemical action having polishing agent and forms the surface more planarized than the surface on which mechanical polishing is performed. As shown in a photomicrograph of FIG. 6(b), performing chemical-mechanical polishing allows the surface of the substrate 70 to be successful on appearance.

Next, an epitaxial layer formation step using a CVD process is performed. In this method, the epitaxial layer 71 is formed by using the CVD process and an off angle on the surface of the substrate 70. The CVD process uses a susceptor 91 or the like, for example, shown in FIG. 6(c). The susceptor 91 is the apparatus for supporting and heating the substrate 70. The susceptor 91 can simultaneously support a plurality of substrates 70, can individually rotate each of substrate 70, and can collectively rotate the plurality of substrates 70 around a rotation shaft 92. This configuration allows to heat the substrates 70 uniformly. The heat treatment is preferably performed in a temperature range of 1200° C. or more and 1600° C. or less.

The substrate 70 is heated while emitting raw material gas in the direction shown by the arrow in FIG. 6(c). This enables to form the epitaxial layer 71 including SiC single crystal (4H—SiC single crystal or 6H—SiC single crystal) on the surface of the substrate 70.

Figure 19:
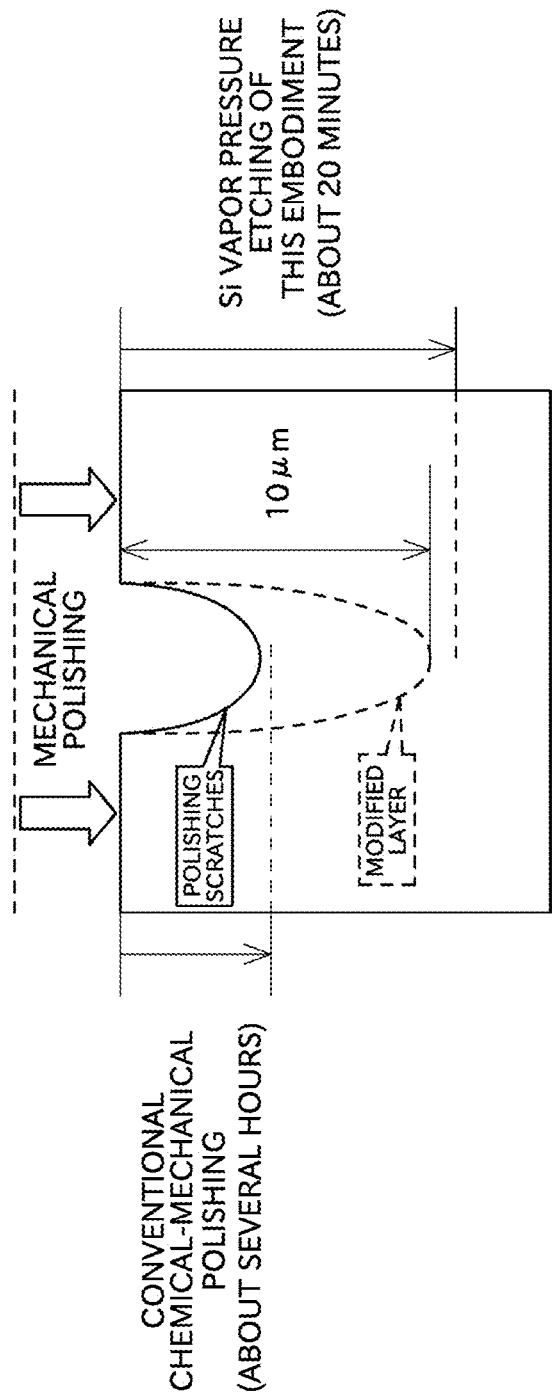
FIG. 19 A diagram showing a schematic cross-section shape of a SiC single crystal substrate having polishing scratches and a modified layer caused by mechanical polishing, a method and required time for removing polishing scratches and a modified layer.

As described the above, however, the pressure is applied to the surface of substrate 70 during mechanical polishing, which causes mechanical distortion (generation of a modified layer). Due to an influence of this modified layer, as shown in photomicrograph of FIG. 6(c), crystal defects are caused by latent scratches on the surface of the epitaxial layer 71. As shown in FIG. 19, the modified layer is generated to a depth of 10000 nm from the surface of the substrate 70. Thus, the chemical-mechanical polishing having low polish rate (about 2 nm/min), which takes five thousand hours or more to remove the whole modified layer, is not practical.

Since the substrate 70 has an off angle, heat treatment or the like when performing a CVD process may cause a growth of steps of the substrate 70 in the direction along with a surface of a substrate, and occurrence of macro-step bunching. Macro-step bunching is a phenomenon in which a plurality of SiC layers forms a bunch of steps (or a step formed by a plurality of SiC layers). Occurrence of this macro-step bunching causes an increase of surface roughness.

Occurrence of macro-step bunching may make the device structure of a semiconductor element unstable, or may cause a local concentration of an electric field to degrade the performance of the semiconductor element. The function as the semiconductor element may not be exerted due to an influence of latent scratches.

Figure 7:
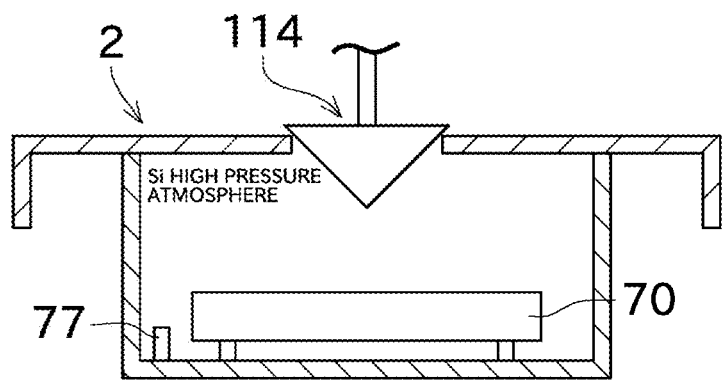
FIG. 7 A diagram showing (a) a status of performing heat treatment under high pressure atmosphere filled with Si vapor pressure, and (b) a status of performing heat treatment under low atmosphere with Si vapor pressure slightly opened toward vacuum back-pressure environment.
Figure 7:
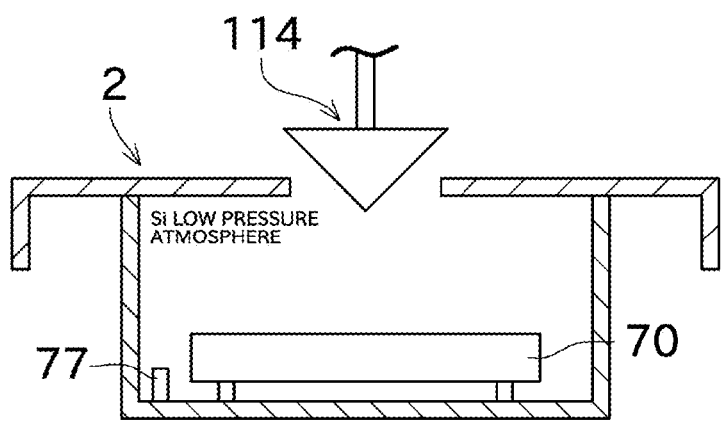

The following description will be given to a manufacturing method of this embodiment in which latent scratches and macro-step bunching can be removed by performing easy treatment at low cost. Firstly, an explanation will be given of the method for changing heat environment (in detail, Si pressure) using the above-described high-temperature vacuum furnace 11. FIG. 7 is a diagram showing a status of performing heat treatment under Si high pressure atmosphere or Si low-pressure atmosphere.

As shown in FIG. 7, a silicon pellet 77 is supplied inside a crucible 2 when heat treatment is performed. Instead of the silicon pellet 77, silicon may be applied to the wall surface of the crucible 2. In this condition, changing the position of a lid 114 allows the degree of sealing in the crucible 2 to be changed. This enables to adjust Si pressure inside the crucible 2.

As shown in FIG. 7(b), for example, a decrease in the degree of sealing in the crucible 2 allows heat treatment to be performed under Si low-pressure atmosphere. On the other hand, as shown in FIG. 7(a), an increase in the degree of sealing in the crucible 2 allows heat treatment to be performed under Si high-pressure atmosphere. The degree of sealing in the crucible 2 can be finely adjusted so that heat treatment can be performed at a desired value of Si pressure.

Figure 8:
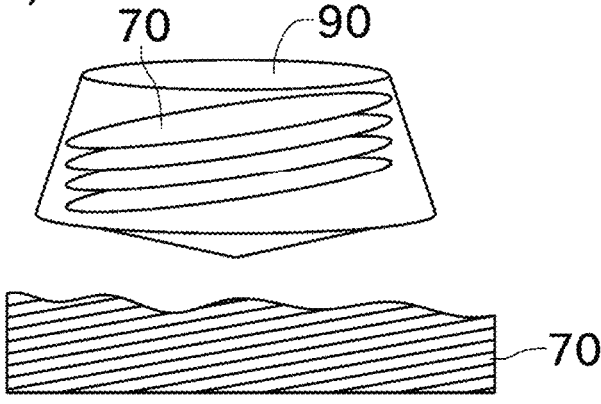
FIG. 8 A diagram shown by a schematic view and an atomic force photomicrograph of treating a surface of a substrate in this embodiment. (a) A diagram showing a surface shape of a substrate in which 4H—SiC bulk single crystal is off-angled at 4 degrees in the direction of <11-20> from (0001)-face and cut out, the surface shape of the substrate having polishing scratches after mechanical polishing. (b) A diagram showing a first removal step and a surface shape of a substrate after planarized, the first removal step for etching a surface region including latent scratches at a high rate uniformly by heating the substrate under Si vapor pressure. (c) A diagram showing a growth step of a SiC epitaxial layer using a CVD process and a surface shape of macro-step bunching appeared after an epitaxial growth. (d) A diagram showing a second removal step and a surface of a substrate after planarized, the second removal step for breaking down and etching a surface region including macro-step bunching at a low rate and uniformly by heating the substrate under Si vapor pressure.
Figure 8:
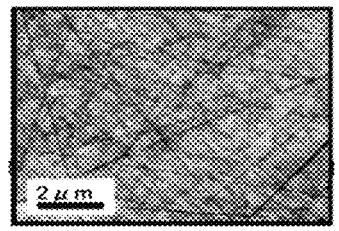
Figure 8:
Figure 8:
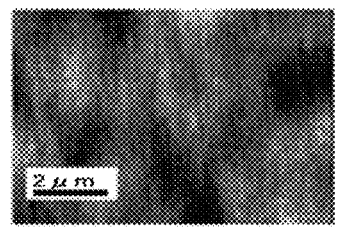
Figure 8:
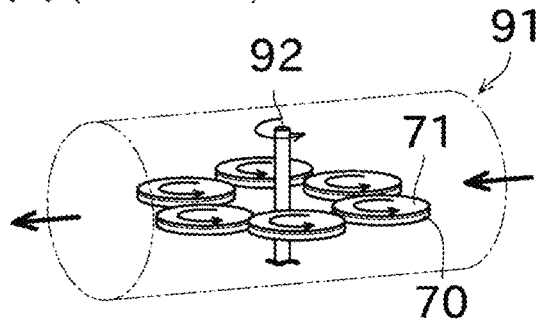
Figure 8:
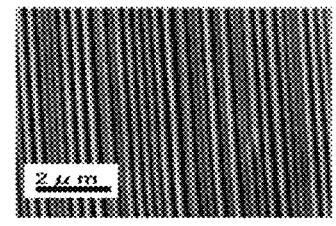
Figure 8:
Figure 8:
Figure 8:
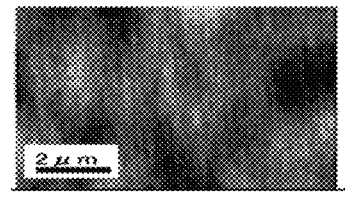

Next, a specific step of this embodiment will be described. FIG. 8 is a diagram shown by a schematic view and an atomic force photomicrograph of treating a surface of a substrate in this embodiment.

Cutting out of an off-angled substrate and mechanical polishing shown in FIG. 8(a) are similar to conventional techniques. FIG. 8 shows a method for manufacturing a semiconductor element using a substrate 70 having an off angle of 4°. More specifically, the surface of the substrate 70 is (0001) Si-face or (000-1) C-face, has an off angle of 4 degrees in the direction of <11-20>, and has an off angle of 4 degrees in the direction of <1-100> (see FIG. 9). In order to form an epitaxial layer efficiently by the following CVD process, an off angle is preferably, for example, about 4 degrees in the direction of <11-20> and <1-100>.

After that, chemical-mechanical polishing is conventionally performed. In this embodiment, however, heat treatment at 1800° C. or more and 2300° C. or less under Si high pressure atmosphere (a condition of FIG. 8(*a*)) is performed so that etching is performed on the surface of the substrate 70 (see a first removal step of FIG. 8(*b*)). As a result of this heat treatment, SiC on the surface of the substrate 70 changes into $Si_2C$ or $SiC_2$ and sublimes, so that the surface of the substrate 70 can be removed.

In this etching treatment, an increase in Si pressure in the crucible results in an increase in etching rate, as detailed later. For example, in a case of Si pressure of $5 \times 10^{-2}$ Pa in a vacuum of $10^{-1}$ Pa, etching rate (polish rate) of the substrate 70 is about 500 nm/min. As a result, the removal of the modified layer, which takes a lot of time, eighty hours or more, through a conventional method, can be completed in about twenty minutes. With this etching treatment (a first removal step), as shown in an atomic force photomicrograph of FIG. 8(*b*), the surface of the substrate 70 is planarized to the molecular level.

Next, similarly to a conventional method, an epitaxial layer growth step is performed by a CVD process. In this embodiment, a modified layer is removed by a first removal step so that latent scratches or the like are not occurred as shown in a photomicrograph of FIG. 8(*c*). However, macro-step bunching shown in FIG. 9 may be occurred on the surface of the substrate 70.

Figure 9:
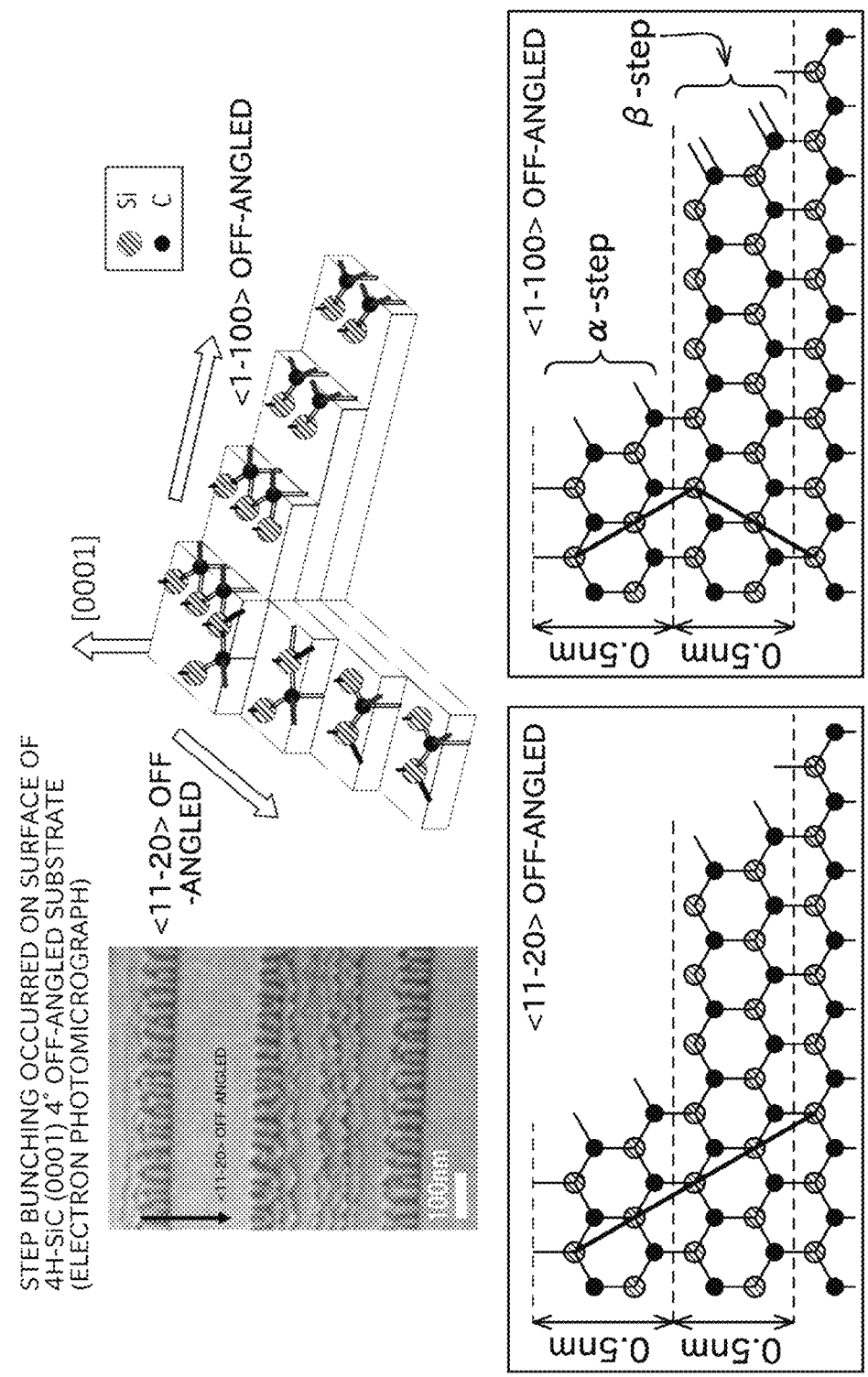
FIG. 9 An atomic arrangement conceptual diagram illustrating the relationship between a surface shape of 4H—SiC (0001) single crystal substrate and an off angle, and a diagram illustrating a mechanism of which macro-step bunching is occurred on a surface of a substrate when etching by heat treatment.

As shown in FIG. 9, in a stepwise step end portion off-angled in the direction of <11-20>, carbon atom has always one unpaired electron (dangling bond) without depending on a stacked configuration of SiC single crystal. On the other hand, in a stepwise step end portion off-angled in the direction of <1-100>, two cases of one unpaired electron (α-step) or two unpaired electrons (β-step) are appeared every two molecular layers with depending on the stacked configuration. In a case of heating SiC single crystal at high temperature, carbon atom existing in the step end portion is easily desorbed so that etching mechanism of the entire surface is controlled. Carbon atom of β-step is easier to be desorbed, from the viewpoint of binding works, as compared with α-step. As a result, etching of β-step proceeds earlier. β-step keeps up with α-step in due course, so that bunching which forms a bunch of steps is induced. This leads to a formation of a stable facet-face in energy. In the substrate off-angled at 4 degrees in the direction of <11-20>, the stability of a step end portion is provided as a group of small facets which expand from the direction of <11-20> to the direction of <1-100> shifted by 30°.

Next, a second removal step is performed on a substrate 70. In the second removal step, Si pressure is set at a predetermined low value and then heat treatment is performed at 1600° C. or more and 2300° C. or less. The surface of the substrate 70 is etched by performing heat treatment in the same principle as a first removal step. Accordingly, as shown in a schematic view and an atomic force photomicrograph of FIG. 8(*d*), macro-step bunching can be removed.

Figure 10:
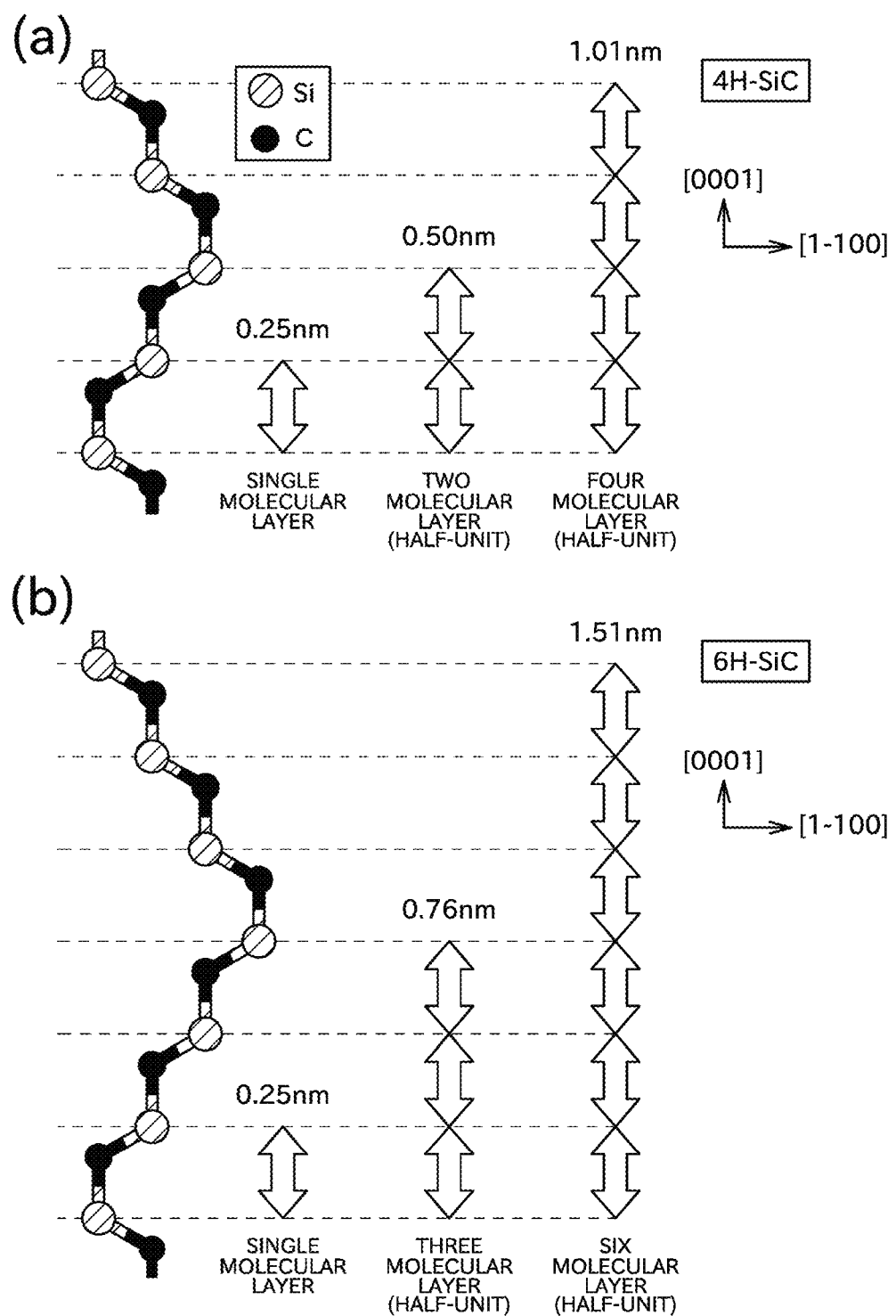
FIG. 10 A schematic view for illustrating a molecular arrangement and a stack period of 4H—SiC single crystal and 6H—SiC single crystal.

In the second removal step, macro-step bunching is removed so that the surface of an epitaxial layer 71 is planarized and terminated at a step having a full-unit height that corresponds to one periodic of SiC molecules in a stack direction or a half-unit height that corresponds to one-half periodic. The "full-unit height" means the height corresponding to one periodic of a stack of SiC single molecular layers including Si and C with respect to a stack direction. Therefore, in a case of 4H—SiC, as shown in FIG. 10(*a*), a step having the full-unit height means a step having a height of 1.01 nm. The "half-unit height" means the height corresponding to half the one periodic with respect to the stack direction. Therefore, in a case of 4H—SiC, as shown in FIG. 10(*a*), a step having the half-unit height means a step having a height of 0.50 nm. In a case of 6H—SiC, as shown in FIG. 10(*b*), a step having the full-unit height means a step having a height of 1.51 nm, and a step having the half-unit height means a step having a height of 0.76 nm.

Figure 11:
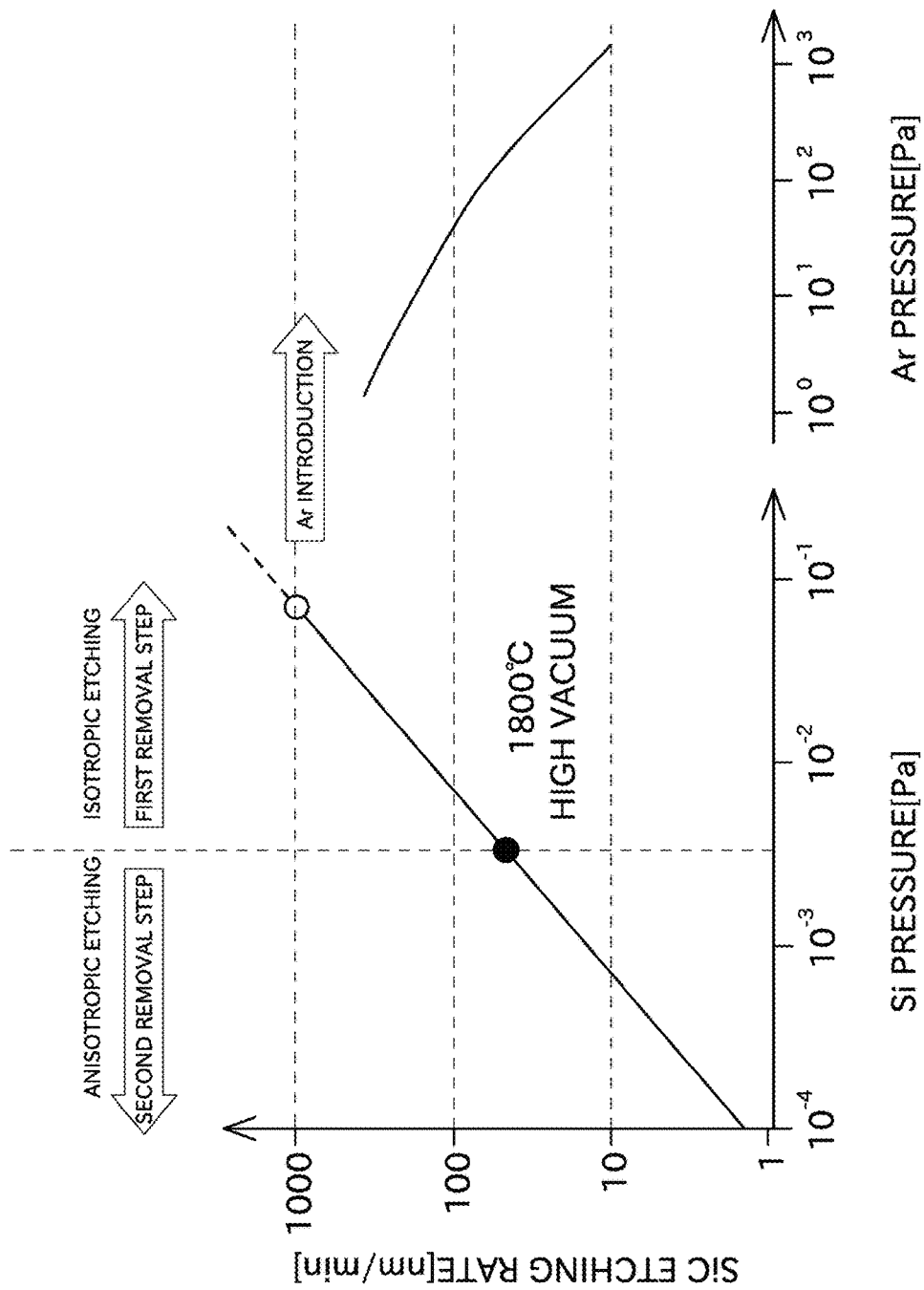
FIG. 11 A diagram showing the characteristic of etching on a surface of a SiC substrate expressed when Si pressure is changed under high vacuum at a fixed temperature (for example, 1800° C.), the change of the characteristic of etching expressed when Ar is introduced (the relation with etching rate depended on Si partial pressure), and the conditions of a first removal step for removing a modified layer of a surface of a SiC single crystal substrate depended on etching rate and a second removal step removing macro-step bunching.

Next, the relationship between Si pressure and etching rate of the substrate 70 will be described with reference to FIG. 11. The left side of a graph in FIG. 11 shows the change of etching rate when Si pressure under vacuum of $10^{-1}$ Pa is changed. This graph shows that etching rate can be changed, for example, from 1 nm/min to 1000 nm/min by changing Si pressure.

In the high-temperature vacuum furnace 11 of this embodiment, moving the lid 114 of the crucible 2 allows Si pressure to be changed easily. This enables to change the etching rate easily corresponding to the condition.

For example, in the above-described first removal step, the high etching rate is preferable since a portion at a depth of about 10000 nm from the surface of the substrate 70 needs to be removed. In the first removal step, it is preferable that, for example, Si pressure is $10^{-2}$ Pa or more. In the second removal step, a portion at a depth of about several ten nm from the surface of the substrate 70 needs to be removed depending on the condition. In the second removal step, it is preferable that the formed epitaxial layer 71 cannot be removed excessively. Thus, in the second removal step, it is preferable that Si pressure is $10^{-3}$ Pa or less.

Next, the relationship between the presence or absence of occurrence of macro-step bunching and heating condition will be described with reference to FIG. 12 to FIG. 14.

Figure 12:
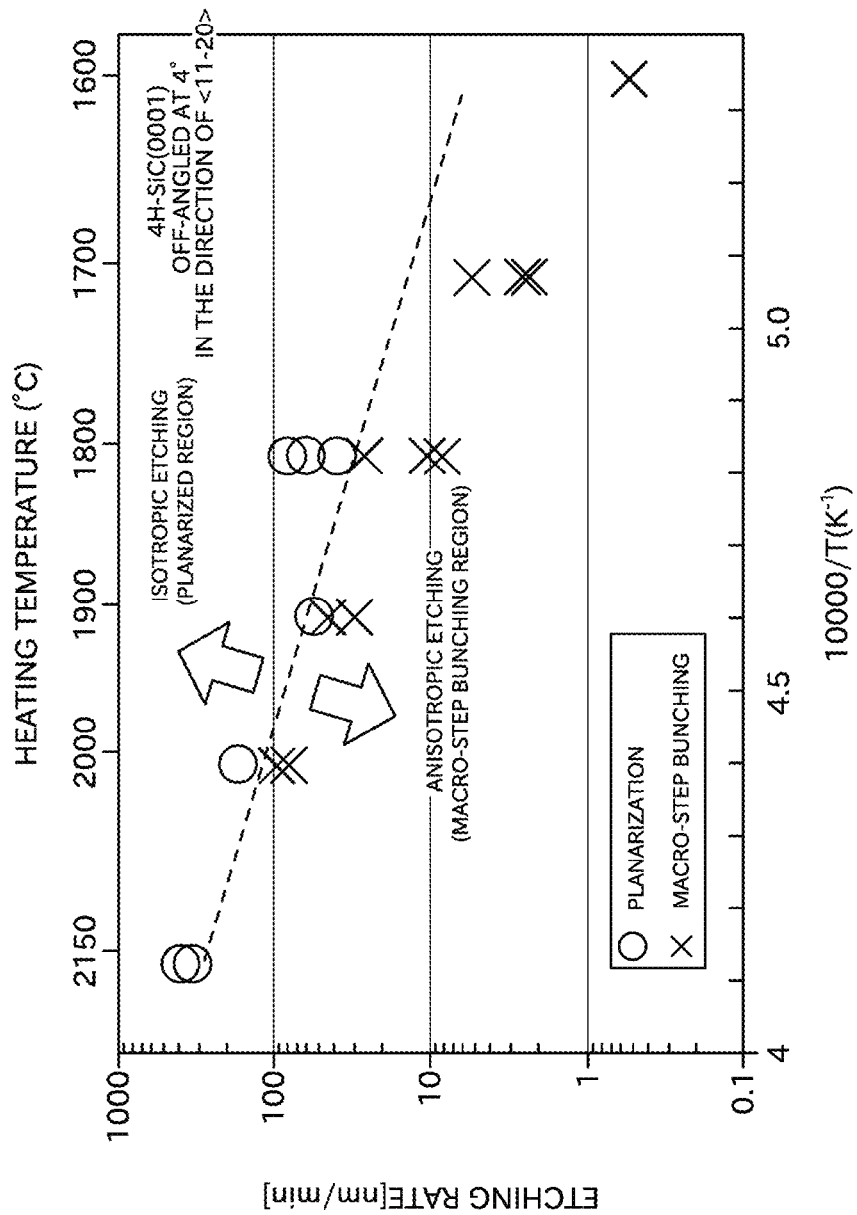
FIG. 12 A graph showing etching rate depended on a Si pressure at a time of changing heating temperature, and the presence or absence of occurrence of macro-step bunching on a surface of an off-angled substrate (an off angle is 4° in the direction of [11-20]).

FIG. 12 is a graph showing the presence or absence of occurrence of macro-step bunching at a time of keeping Si pressure constant and changing the conditions such as heating temperature and the like. The graph of FIG. 12 shows the express of an isotropic etching in the region having high etching rate above a boundary line (a dashed line of FIG. 12), and the express of an anisotropic etching in the region having low etching rate below the boundary line (a dashed line of FIG. 12). Breakdown of macro-step bunching is occurred in the region of the isotropic etching. That is, the graph of FIG. 12 shows that, in a case of logarithmically representing etching rate, macro-step bunching is not occurred in a region above a predetermined straight line (a dashed line of FIG. 12), and macro-step bunching is occurred in a region below the straight line.

Figure 13:
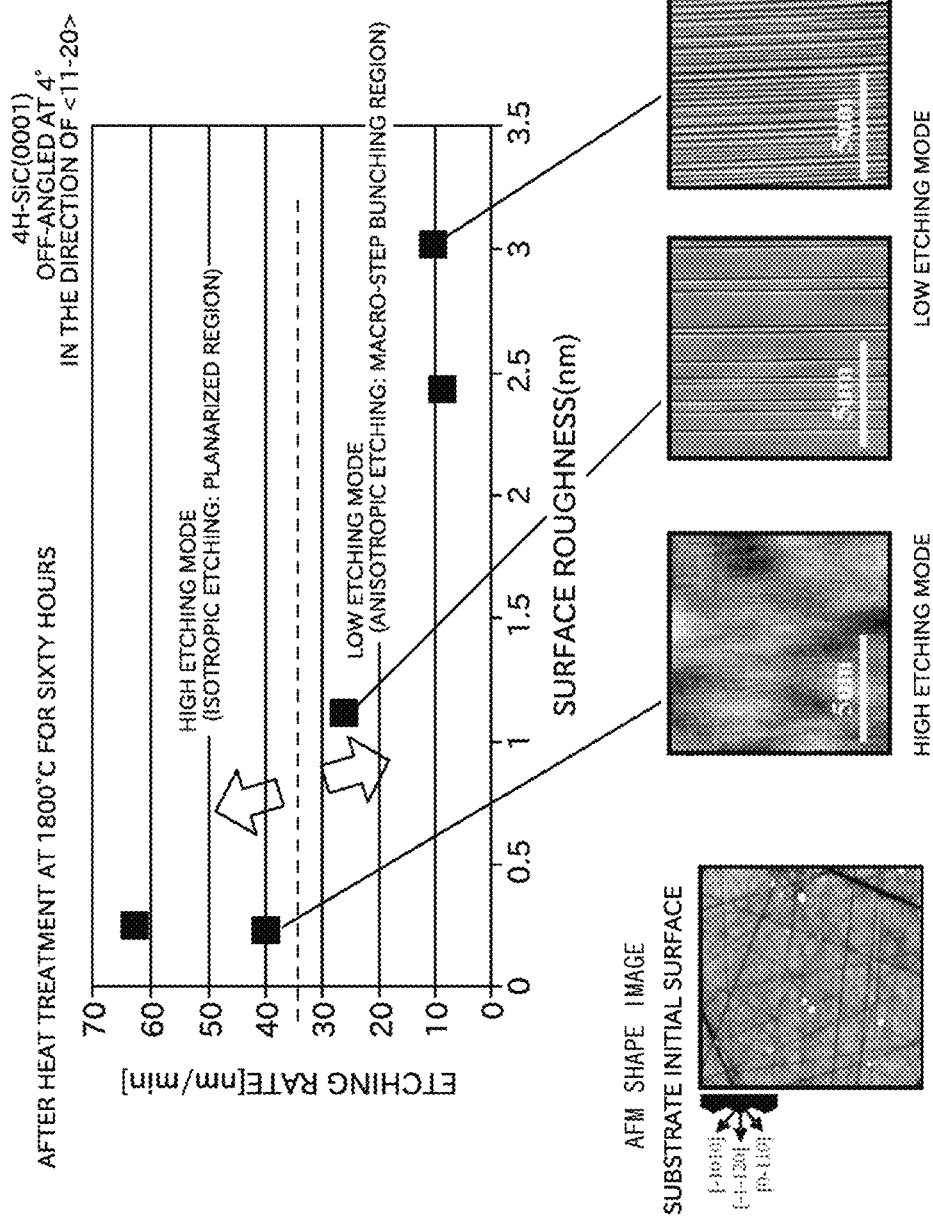
FIG. 13 A graph showing the relationship between etching rate and a status of a surface of a SiC substrate under the conditions of predetermined heating temperature and heating time.

FIG. 13 shows the relationship between etching rate and a status of a surface of a SiC substrate (the presence or absence of occurrence of macro-step bunching) when heat treatment at 1800° C. for sixty minutes is performed. It can be found from the graph of FIG. 13 that, in a case of low etching rate (low etching mode), macro-step bunching is occurred. On the other hand, in a case of high etching rate (high etching mode), macro-step bunching can be broken down and occurrence of macro-step bunching can be suppressed.

Figure 14:
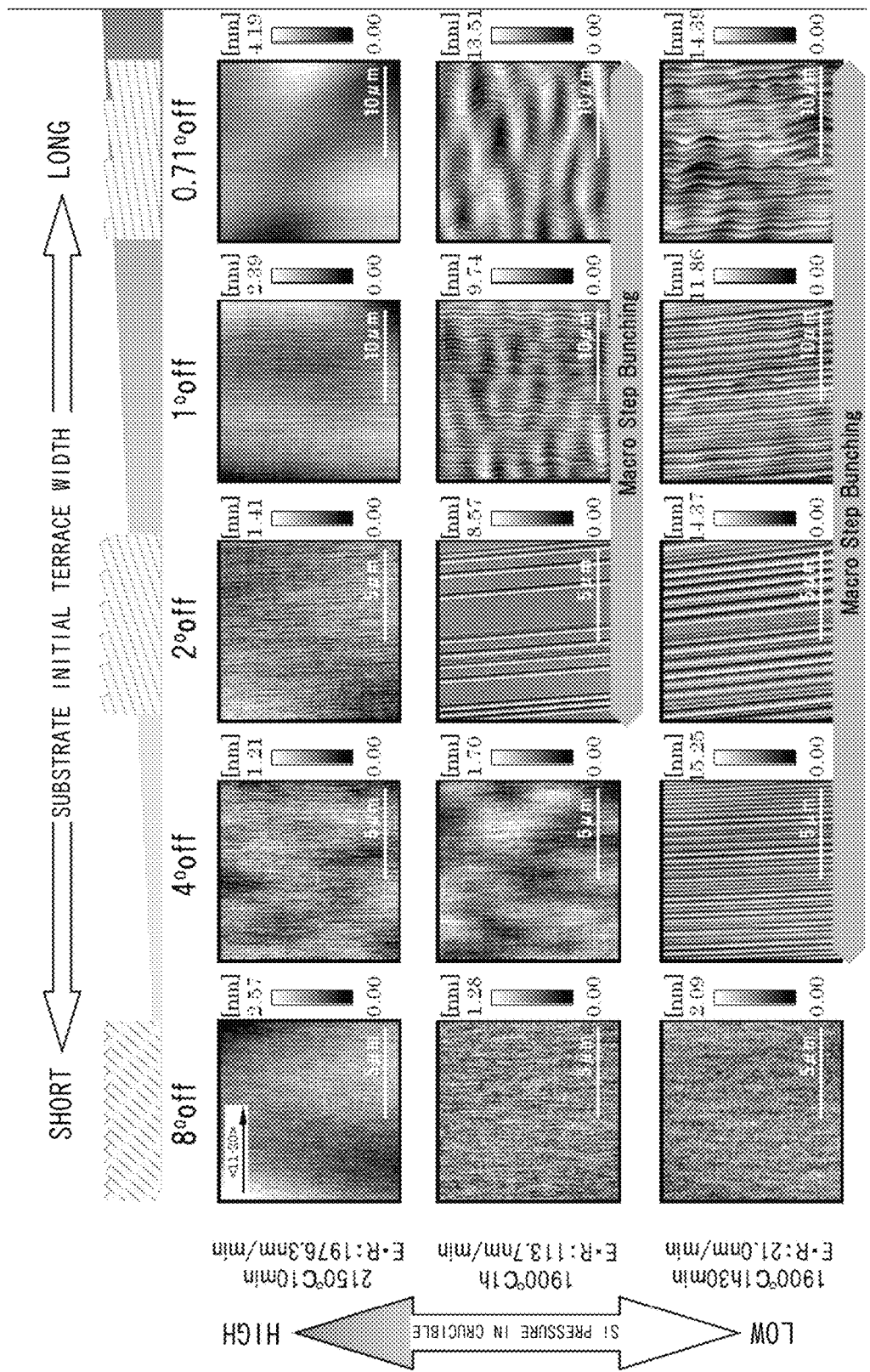
FIG. 14 A diagram showing an atomic force photomicrograph of a substrate surface when heat treatment is respectively performed on a substrate having a different off angle under an environment having different Si pressure.

FIG. 14 shows an atomic force photomicrograph of a substrate surface when heat treatment is respectively performed on a substrate 70 having a different off angle under the environment having different Si pressure. In the atomic force photomicrograph, a portion wherein macro-step bunching is occurred is described as "Macro Step Bunching" below thereof.

FIG. 14 shows that macro-step bunching is more likely to occur, if Si pressure is lower (etching rate is lower). FIG. 14 also shows that macro-step bunching is more likely to occur, if an off angle is smaller (an initial terrace width is longer).

Thus, the presence or absence of occurrence of macro-step bunching is related to heating condition (Si pressure, heating temperature, etching rate and the like) and an object of heating (an off angle of a substrate). Therefore, setting the heat conditions by using this relationship enables to reliably prevent occurrence of macro-step bunching in a first removal step or a second removal step.

Next, with reference to FIGS. 15 to 18, the principle of occurrence of macro-step bunching will be described.

Figure 15:
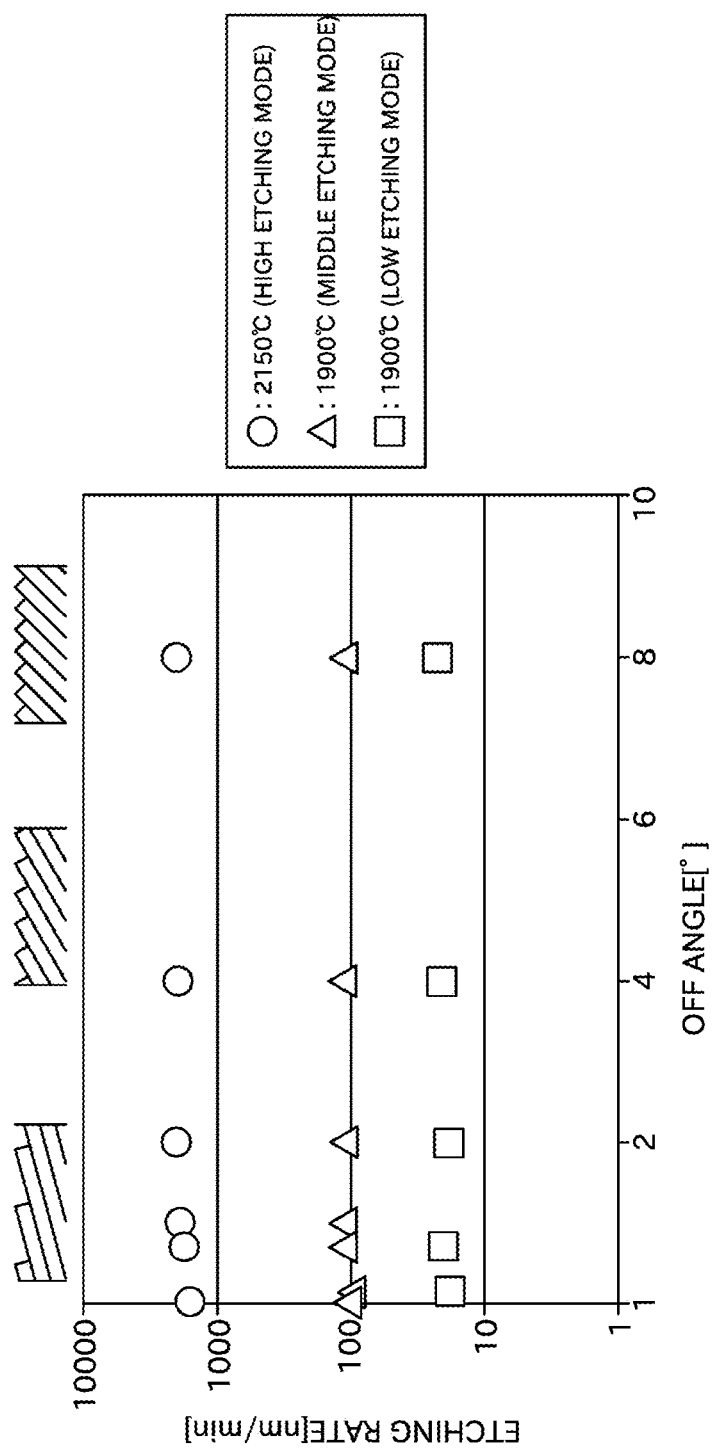
FIG. 15 A diagram showing etching rate when a heating condition is varied according to a substrate having a different off angle.
Figure 16:
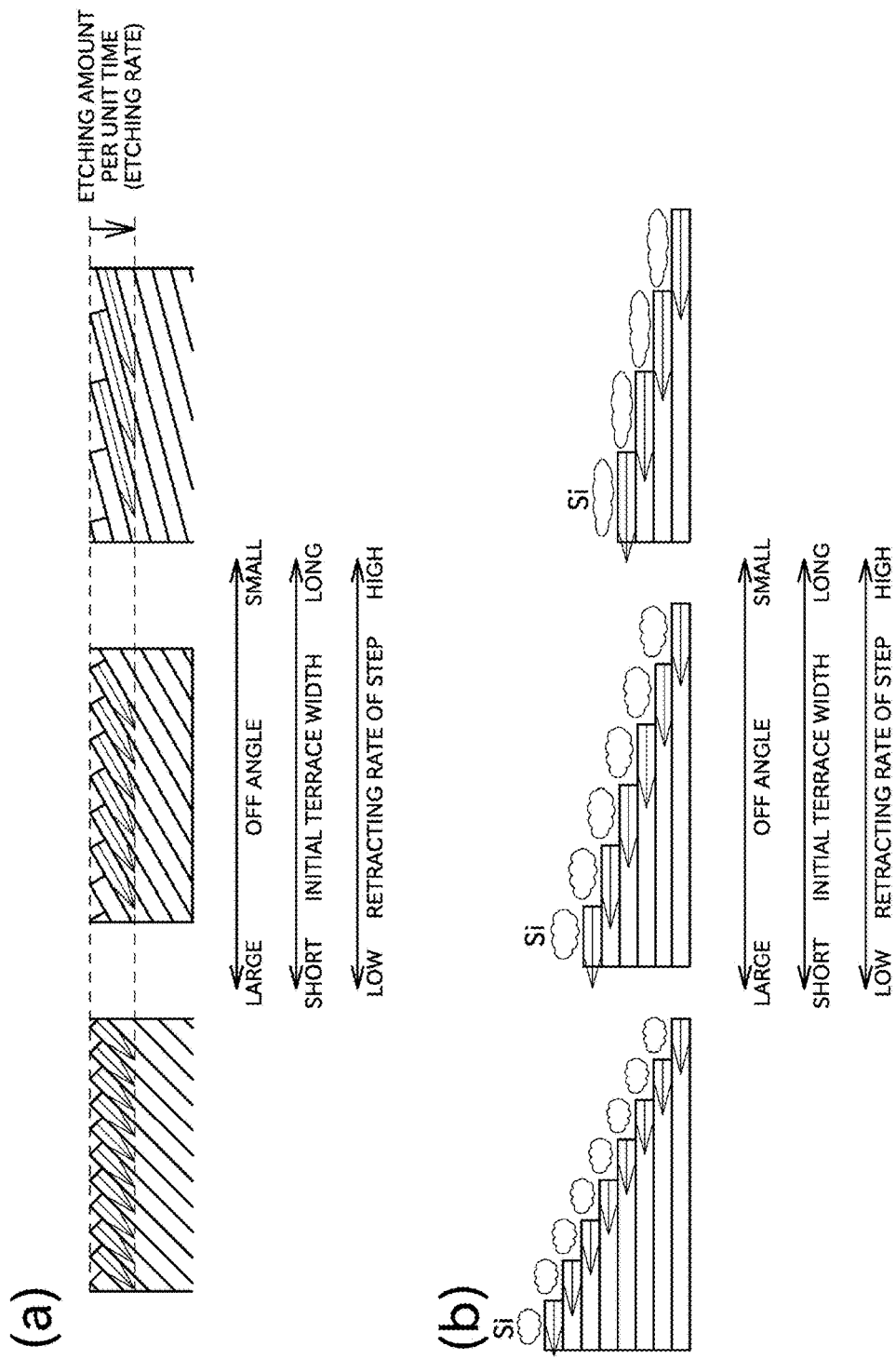
FIG. 16 A diagram comparing retracting rate of a step with an initial terrace width.

FIG. 15 is a diagram showing etching rate when heating condition is different according to a substrate 70 having a different off angle. FIG. 15 shows that etching rate is determined depending on heating condition, and etching rate does not depend on an off angle of the substrate 70.

As shown in FIG. 16(a), etching rate is the decreasing rate in a thickness direction of a substrate. Therefore, it is found that retracting rate (the arrow in FIG. 16(a)) of each steps of a substrate 70 is low as an off angle is larger (an initial terrace width is shorter).

The following description will be given to this result. Firstly, etching rate of each steps depends on the amount of Si diffused to each steps (that is, a portion of contacting with Si atmosphere). FIG. 16(b) is a diagram in which an angle of each substrate is uniformized, and a cloud-shaped mark shows gaseous Si located on a step. FIG. 16(b) shows that a terrace width is shorter as an off angle is larger. Accordingly, the amount of Si contacting with each steps is small and then Si is not easily sublime from the substrate. Therefore, retracting rate of the step is lower if the off angle is larger.

Figure 17:
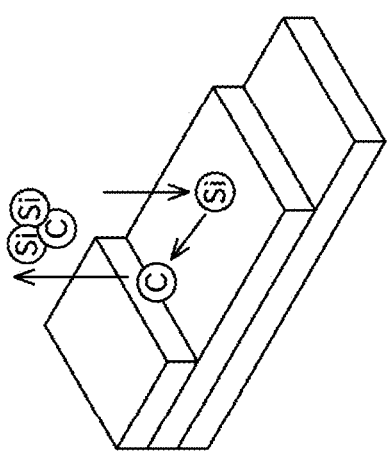
FIG. 17 A diagram schematically showing cases of suppressing and progressing occurrence of macro-step bunching.
Figure 17:
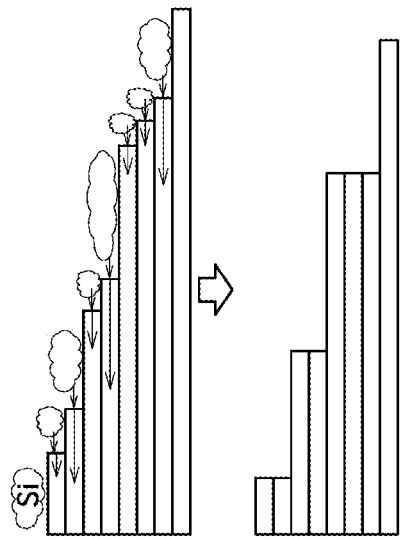
Figure 17:
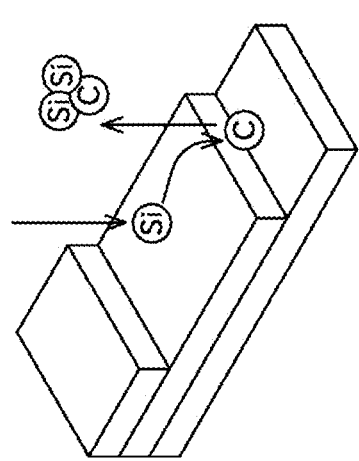
Figure 17:
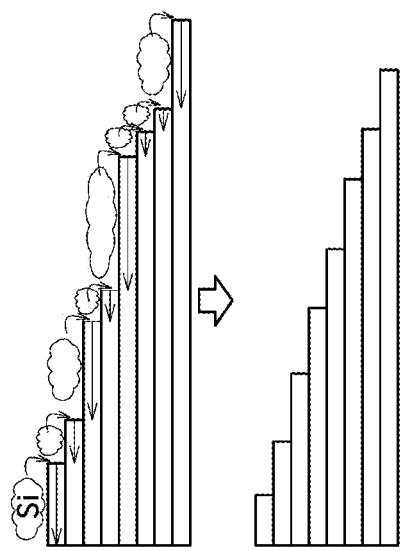

The gaseous Si located on a step is, as shown in FIG. 17 (a1), may contribute to the retraction of a lower step or, as shown in FIG. 17 (b1), may contribute to retraction of one upper step (the same height as that of gaseous Si).

FIG. 17 (a2) shows a case that gaseous Si located on a step contributes to the retraction of a lower step, as follows. The retracting rate is high in a step having a long terrace width and the retracting rate is low in a step having a short terrace width. As a result, the terrace widths of a substrate 70 is uniformized.

On the other hand, FIG. 17 (b2) shows a case that gaseous Si located on a step contributes to the retraction of an upper step, as follows. The retracting rate is high in one upper step of a step having a long terrace width and the retracting rate is low in one upper step of a step having a short terrace width. As a result, the terrace widths of a substrate 70 are same as upper terrace width and then step bunching is occurred.

Figure 18:
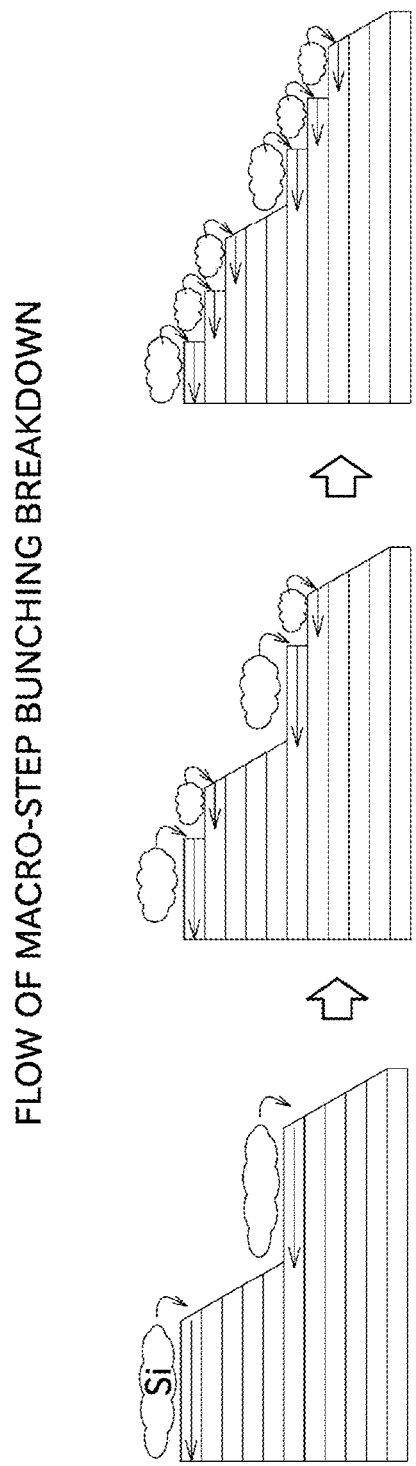
FIG. 18 A diagram showing a flow when removing (breaking down) the occurred macro-step bunching.

Even when step bunching is already occurred, as shown in FIG. 18, Si located on a step contributes to the retraction of a lower step and then the top step of step bunching is retracted. This leads to appearance of a second step. Thus, a bunch of steps is gradually broken down such that the retraction of the second step leads to the retraction of a third step. After that, similarly to FIG. 17 (a2), since each steps is retracted so as to uniformize the terrace widths of the substrate 70, step bunching can be removed.

As described above, gaseous Si located on a step contributes to the retraction of a lower step so that occurrence of macro-step bunching can be prevented in a first removal step and macro-step bunching can be appropriately removed in a second removal step. All of gaseous Si do not need to contribute to the retraction of a lower step. High ratio of contribution of gaseous Si to the retraction of the lower step is sufficient.

Considering the above-described experimental results, a case of high ratio, in which Si on a step contributes to the retraction of a lower step, will be conceivable as follows. The case is that Si pressure in a crucible 2 is high (etching rate is high) and an initial terrace width is short (an off angle is large). Performing a first removal step and a second removal step on the basis of above consideration enables to reliably prevent occurrence of macro-step bunching.

As described above, in a method for treating a surface of a substrate 70 of this embodiment, a first removal step, in which a modified layer produced by subjecting the substrate 70 to mechanical polishing or chemical-mechanical polishing is removed by heating the substrate 70 under Si vapor pressure, is performed.

Accordingly, removing the modified layer in the first removal step can prevent occurrence of latent scratches. This enables to improve a yield of a semiconductor element. Additionally, since etching rate (polish rate) is high in the first removal step, the modified layer can be removed in a short time and the production efficiency of the semiconductor element can be improved.

In the method for treating a substrate of this embodiment, a second removal step is performed. In the second removal step, macro-step bunching occurred on an epitaxial layer 71 which is formed on a surface of a substrate 70 by using a CVD process is removed by heating the substrate 70 under Si vapor pressure.

Accordingly, macro-step bunching occurred on a surface of the substrate 70 can be removed appropriately.

Although a preferred embodiment of the present invention has been described above, the above-described configuration may be modified, for example, as follows.

The environment of the treatment, the single crystal SiC substrate used, and the like, are merely illustrative ones, and the present invention is applicable to various environments and various types of single crystal SiC substrates. For example, the heating temperature and the pressure are not limited to the values illustrated above, they can be changed as appropriate.

| DESCRIPTION OF REFERENCE NUMERALS | |
|---|---|
| 2 | crucible |
| 11 | high-temperature vacuum furnace |
| 70 | substrate |
| 71 | epitaxial layer |
| 114 | lid |

The invention claimed is:

1. A method for treating a surface of a SiC substrate having an off angle, the substrate having at least its surface made of (0001) Si-face or (000-1) C-face, the method comprising:

cutting the SiC substrate out of an ingot;

generating a modified layer in the SiC substrate by applying pressure to the surface of the substrate with mechanical polishing or chemical-mechanical polishing, said mechanical polishing or chemical-mechanical polishing causing polishing scratches on the surface of the SiC substrate with said modified layer inside the polishing scratches; and performing a first removal step of removing a depth including about 10 μm from the surface of the SiC substrate including removing the polishing scratches and the modified layer produced by subjecting the substrate to said mechanical polishing or chemical-mechanical polishing by heating the substrate under Si vapor pressure, wherein said first removal step includes performing isotropic etching, said isotropic etching being in a region above a boundary line in a graph logarithmically representing etching rate.

2. The method for treating the surface of the SiC substrate according to claim 1, wherein
in the first removal step, heating is performed in a temperature range of 1800° C. or more and 2300° C. or less and under the Si vapor pressure of $10^{-2}$ Pa or more.

3. The method for treating the surface of the SiC substrate according to claim 1, the method comprising:
performing a second removal step of removing macro-step bunching produced on an epitaxial layer formed on the surface of the substrate using a chemical vapor deposition process by heating the substrate under the Si vapor pressure.

4. The method for treating the surface of the SiC substrate according to claim 3, wherein
in the second removal step, etching rate is lower than that of the first removal step and a depth of about several tens nm is removed from the surface of the SiC substrate.

5. The method for treating the surface of the SiC substrate according to claim 3, wherein
in the second removal step, heating is performed in a temperature range of 1600° C. or more and 2000° C. or less, and under the Si vapor pressure of $10^{-3}$ Pa or less.

6. The method for treating the surface of the SiC substrate according to claim 3, wherein
in consideration of the relationship between heating condition including the Si vapor pressure, heating temperature and etching rate and the presence or absence of occurrence of the macro-step bunching, the heating condition is determined in at least either one of the first removal step or the second removal step.

7. The method for treating the surface of the SiC substrate according to claim 6, wherein
in further consideration of the off angle of the substrate, the heating condition is determined.

8. The method for treating the surface of the SiC substrate according to claim 1, wherein
the surface of the substrate has an off angle of 4 degrees or less in the direction of <11-20>.

9. The method for treating the surface of the SiC substrate according to claim 1, wherein
the surface of the substrate has an off angle of 4 degrees or less in the direction of <1-100>.

10. The method for treating the surface of the SiC substrate according to claim 1, wherein
the surface of the substrate is terminated at a step having a full-unit height that corresponds to one periodic of SiC molecules in a stack direction or a half-unit height that corresponds to one-half periodic.

11. The method for treating the surface of the SiC substrate according to claim 1, wherein said removing in said first removal step is at a rate of about 100 nm/min or more.

12. The method for treating the surface of the SiC substrate according to claim 11, wherein said removing in said first removal step is at a rate of about 500 nm/min or more.

13. The method for treating the surface of the SiC substrate according to claim 1, wherein macro-step bunching does not occur in the region above the boundary line.

14. The method for treating the surface of the SiC substrate according to claim 13, wherein the macro-step bunching occurs in a region below the boundary line.

* * * * *